(12) United States Patent
Schilling et al.

(10) Patent No.: US 10,850,552 B2
(45) Date of Patent: Dec. 1, 2020

(54) METHOD FOR PRODUCING SECURITY ELEMENTS HAVING A LENTICULAR FLIP

(71) Applicant: OVD Kinegram AG, Zug (CH)

(72) Inventors: Andreas Schilling, Hagendorn (CH); Rene Staub, Hagendorn (CH); Philipp Schuler, Morschach (CH); Achim Hansen, Zug (CH)

(73) Assignee: OVD KINEGRAM AG, Zug (CH)

( * ) Notice: Subject to any disclaimer, the term of this patent is extended or adjusted under 35 U.S.C. 154(b) by 0 days.

(21) Appl. No.: 16/301,794

(22) PCT Filed: May 8, 2017

(86) PCT No.: PCT/EP2017/060931
§ 371 (c)(1),
(2) Date: Nov. 15, 2018

(87) PCT Pub. No.: WO2017/198486
PCT Pub. Date: Nov. 23, 2017

(65) Prior Publication Data
US 2019/0152251 A1    May 23, 2019

(30) Foreign Application Priority Data
May 19, 2016   (DE) .................. 10 2016 109 193

(51) Int. Cl.
*H01L 21/311*   (2006.01)
*H01L 21/31*    (2006.01)
(Continued)

(52) U.S. Cl.
CPC ......... *B42D 25/445* (2014.10); *B42D 25/324* (2014.10); *B42D 25/328* (2014.10); *B42D 25/351* (2014.10); *B42D 25/373* (2014.10); *B42D 25/41* (2014.10); *B42D 25/42* (2014.10); *B42D 25/45* (2014.10); *G02B 3/0037* (2013.01); *G02B 3/0043* (2013.01); *G02B 30/27* (2020.01); *G03B 25/02* (2013.01); *G03B 35/24* (2013.01);
(Continued)

(58) Field of Classification Search
None
See application file for complete search history.

(56) References Cited

U.S. PATENT DOCUMENTS 5,657,111 A * 8/1997 Lo ..................... G02B 27/2214
                                                      355/22
6,016,225 A    1/2000 Anderson
(Continued)

FOREIGN PATENT DOCUMENTS

DE    102006005000 A1    8/2007
DE    102009040975 A1    3/2011
(Continued)

*Primary Examiner* — Stephanie P Duclair
(74) *Attorney, Agent, or Firm* — Hoffmann & Baron, LLP

(57) ABSTRACT

A method for producing a security element formed as a lenticular flip, including a micro-optical layer, a carrier substrate and an image layer, wherein the image layer includes n images for n=1 to i which are visible from an n-th observation angle allocated to the n-th image, and wherein n is at least 1. The images are imaged on a photoresist with parallel light in contact print or by means of projection. After the photoresist is developed, an image layer which includes the i images is present.

44 Claims, 25 Drawing Sheets

(51) Int. Cl.
| | |
|---|---|
| *H01L 21/308* | (2006.01) |
| *H01L 21/3065* | (2006.01) |
| *G03F 7/30* | (2006.01) |
| *G03F 7/20* | (2006.01) |
| *G03B 35/24* | (2006.01) |
| *G03B 25/02* | (2006.01) |
| *G02B 30/27* | (2020.01) |
| *G02B 3/06* | (2006.01) |
| *G02B 3/00* | (2006.01) |
| *B42D 25/45* | (2014.01) |
| *B42D 25/445* | (2014.01) |
| *B42D 25/42* | (2014.01) |
| *B42D 25/373* | (2014.01) |
| *B42D 25/351* | (2014.01) |
| *B42D 25/328* | (2014.01) |
| *B42D 25/324* | (2014.01) |
| *B42D 25/41* | (2014.01) |

(52) U.S. Cl.
CPC ........ *H01L 21/308* (2013.01); *H01L 21/3065* (2013.01); *H01L 21/3081* (2013.01); *H01L 21/3083* (2013.01); *H01L 21/30655* (2013.01); *H01L 21/31* (2013.01); *H01L 21/311* (2013.01); *H01L 21/31105* (2013.01); *H01L 21/31111* (2013.01); *G02B 3/06* (2013.01); *G03F 7/20* (2013.01); *G03F 7/30* (2013.01)

(56) References Cited

U.S. PATENT DOCUMENTS

| | | | |
|---|---|---|---|
| 8,094,376 B2 | 1/2012 | Schilling et al. | |
| 9,994,062 B2 | 6/2018 | Schilling et al. | |
| 2007/0058260 A1* | 3/2007 | Steenblik | B42D 25/355 359/626 |
| 2007/0211317 A1* | 9/2007 | Heim | B42D 25/23 359/2 |
| 2012/0091703 A1* | 4/2012 | Maguire | G07D 7/003 283/85 |
| 2012/0268598 A1* | 10/2012 | Holmes | B42D 25/342 348/143 |
| 2013/0154250 A1 | 6/2013 | Dunn et al. | |
| 2014/0177008 A1 | 6/2014 | Raymond et al. | |
| 2014/0306441 A1* | 10/2014 | Lister | G03F 7/2002 283/85 |

FOREIGN PATENT DOCUMENTS

| | | |
|---|---|---|
| EP | 0560180 A2 | 9/1993 |
| WO | 2016/016638 A1 | 2/2016 |

* cited by examiner

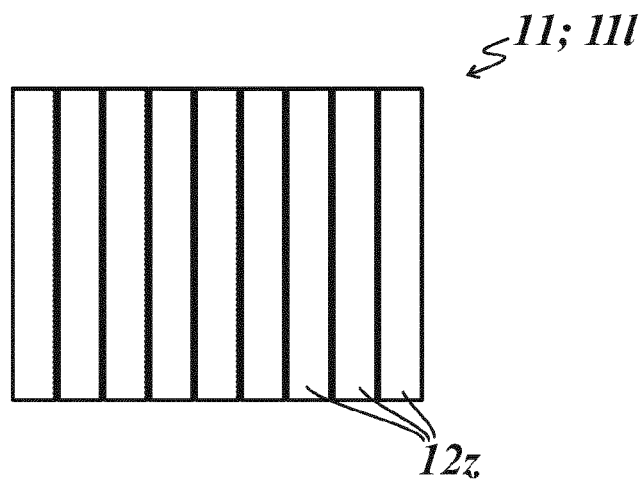
*Fig. 2.1*
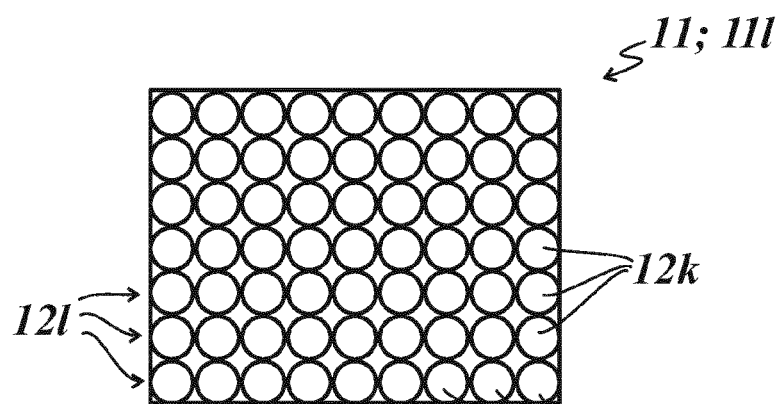
*Fig. 2.2*
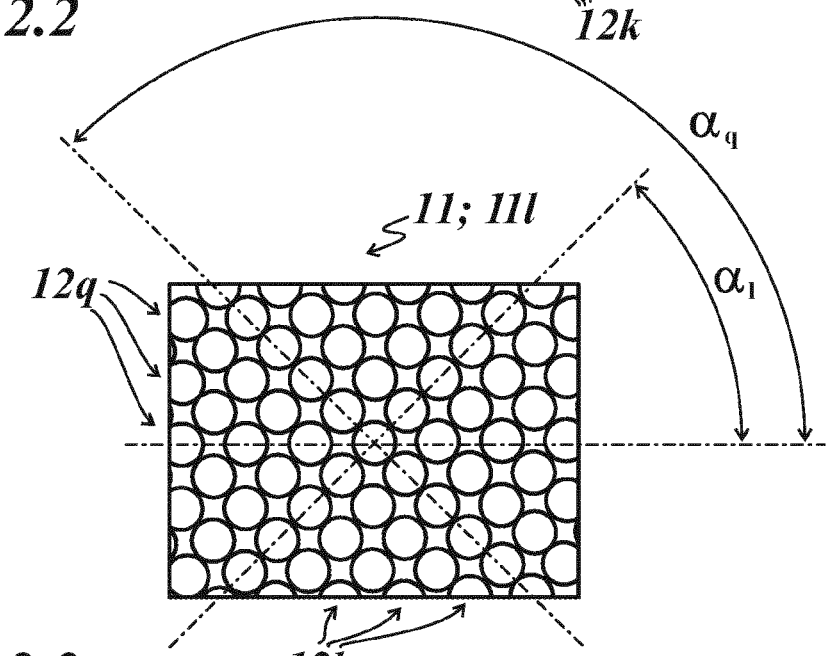
*Fig. 2.3*

*Fig. 3.1* 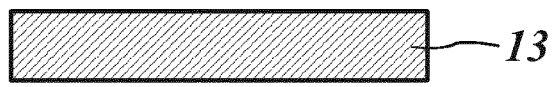
*Fig. 3.2* 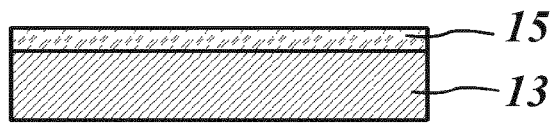
*Fig. 3.3* 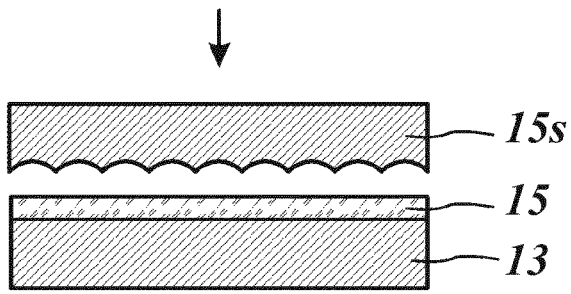
*Fig. 3.4* 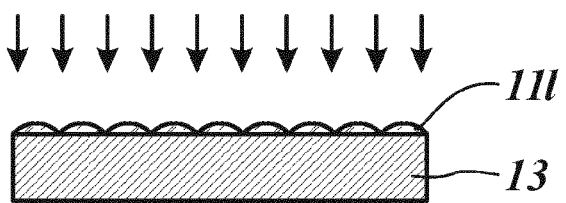
*Fig. 3.5* 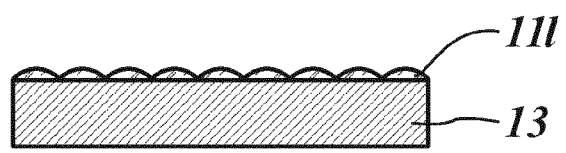

*Fig. 4.1*
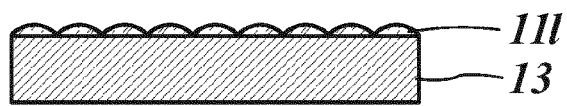
*Fig. 4.2*
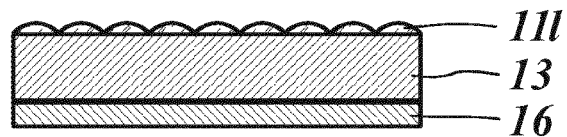
*Fig. 4.3*
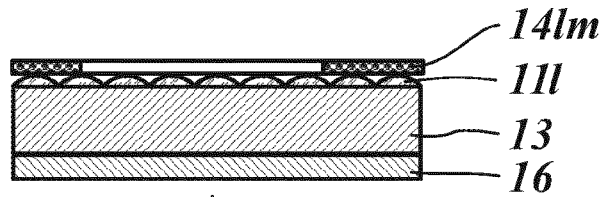
*Fig. 4.4*
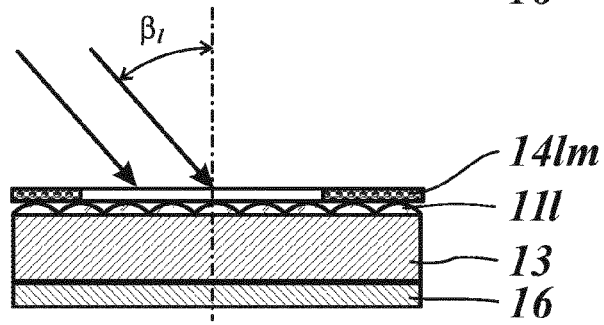
*Fig. 4.5*
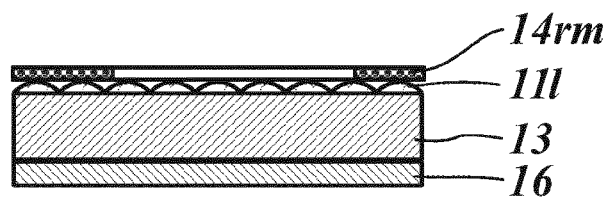
*Fig. 4.6*
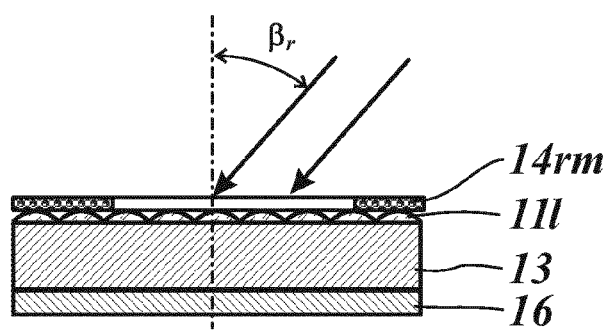
*Fig. 4.7*
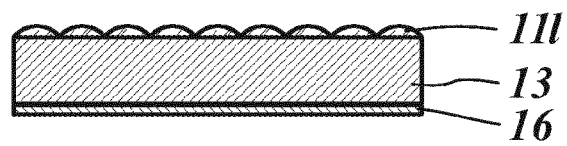
*Fig. 4.8*
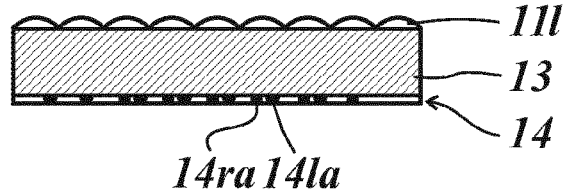

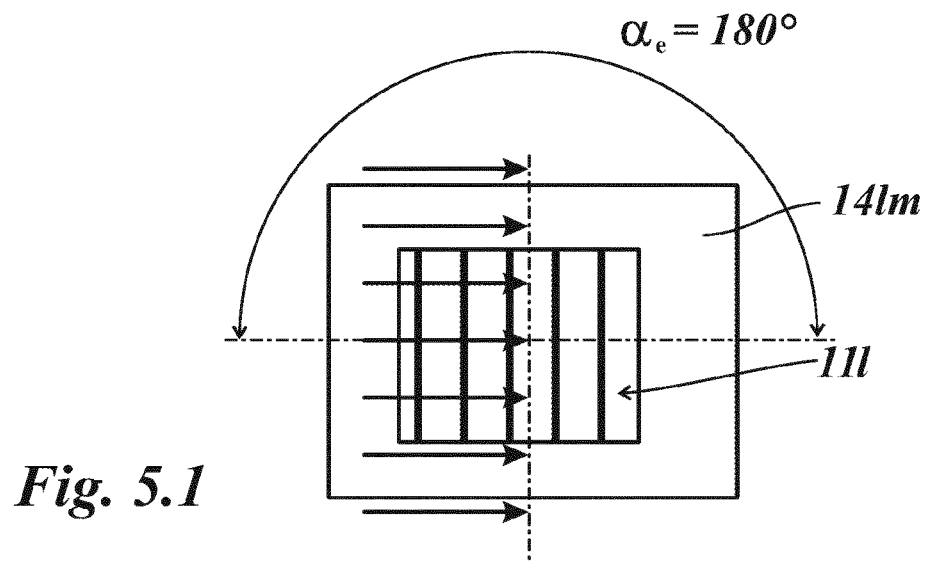
*Fig. 5.1*
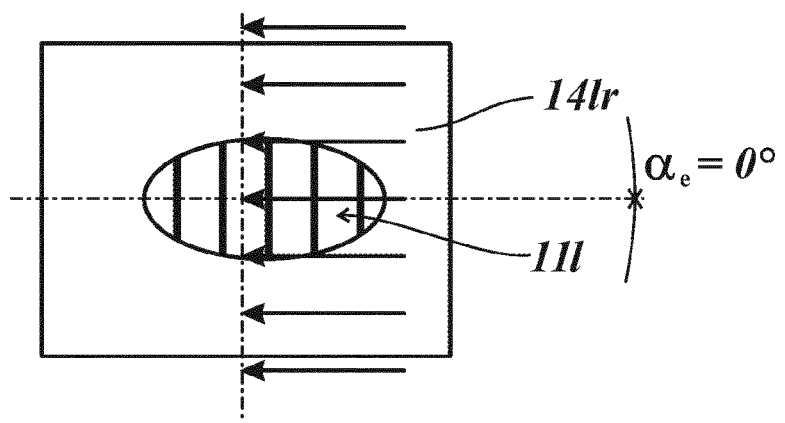
*Fig. 5.2*

*Fig. 6.1*
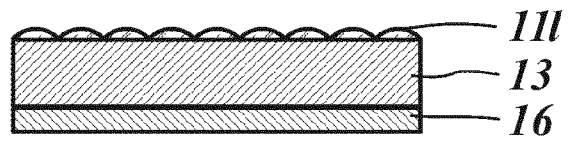
*Fig. 6.2*
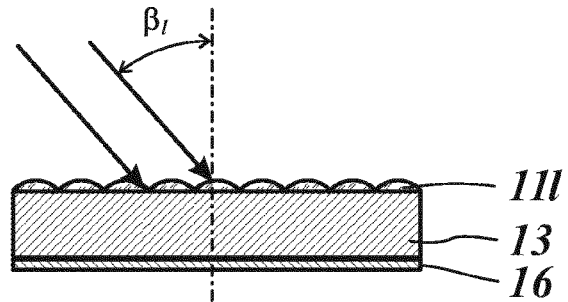
*Fig. 6.3*
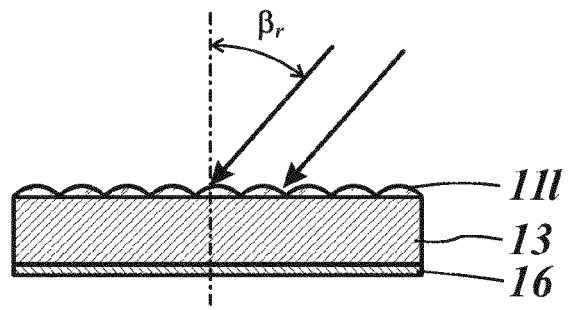
*Fig. 6.4*
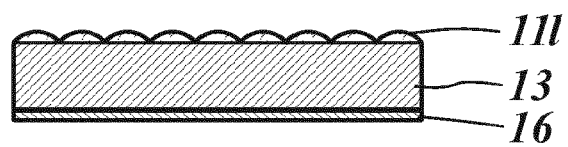
*Fig. 6.5*
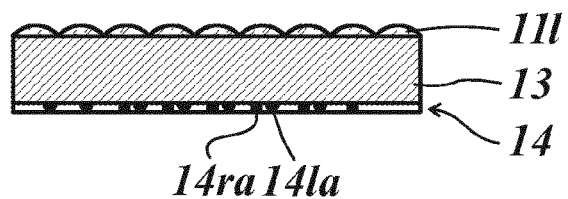
*Fig. 6.6*

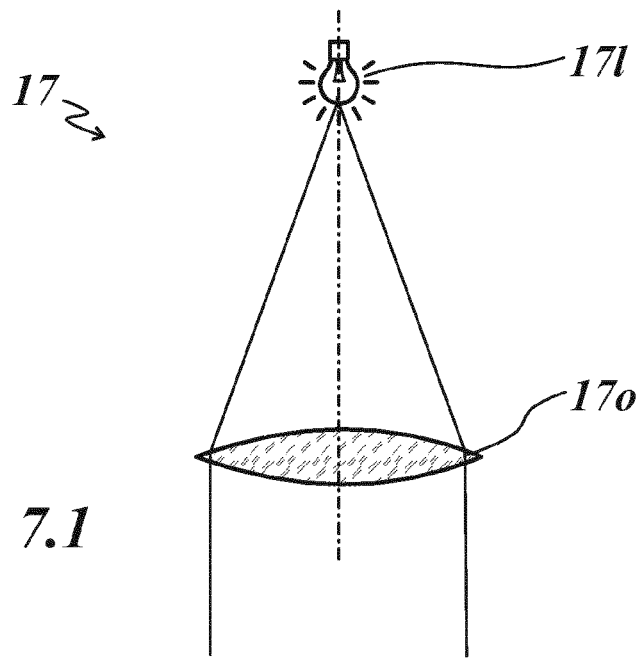
*Fig. 7.1*
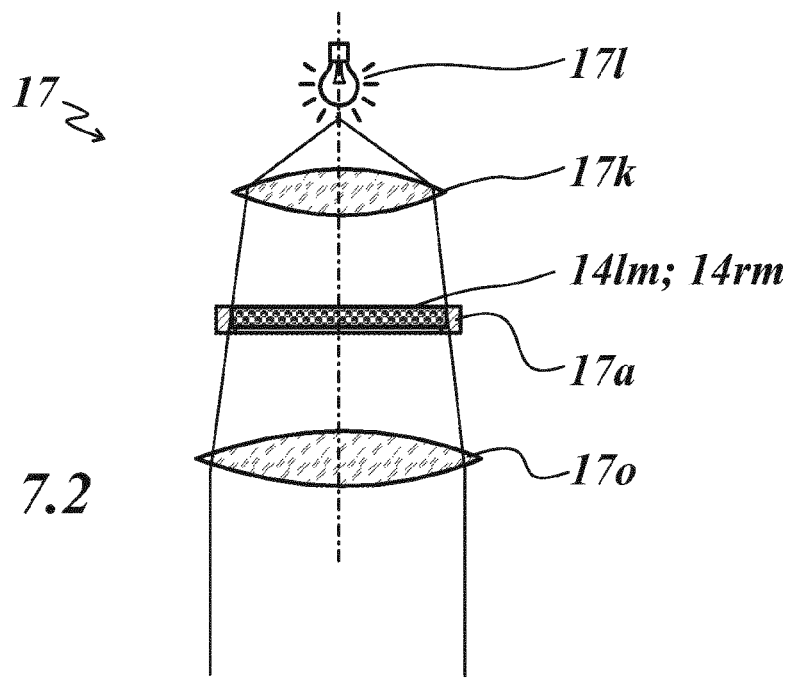
*Fig. 7.2*

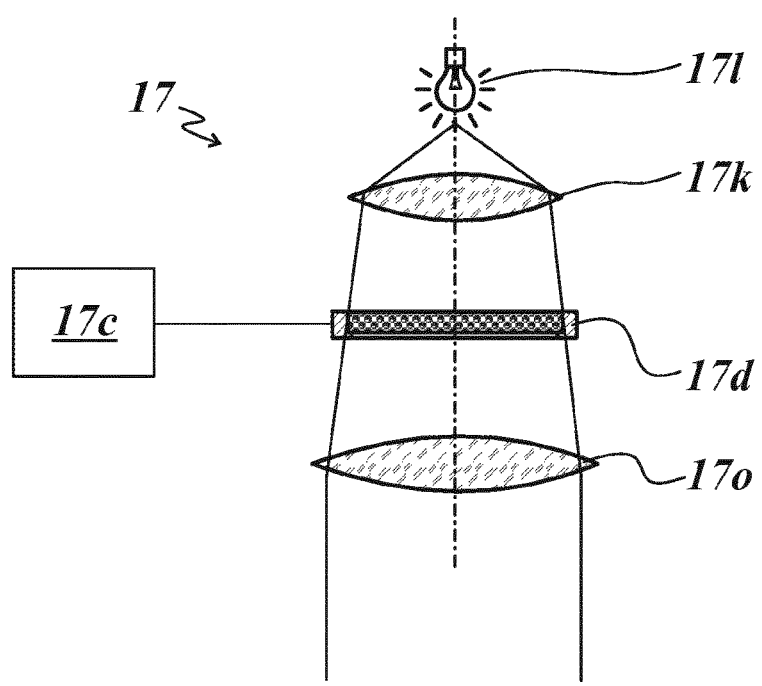
Fig. 7.3

*Fig. 8.1*
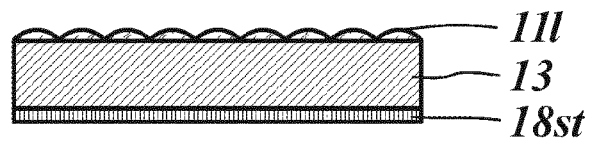
*Fig. 8.2*
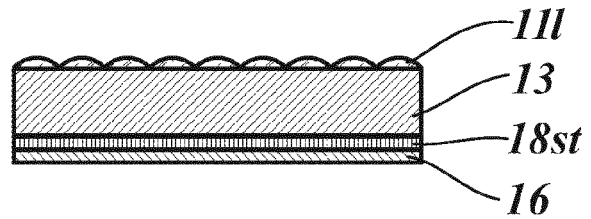
*Fig. 8.3*
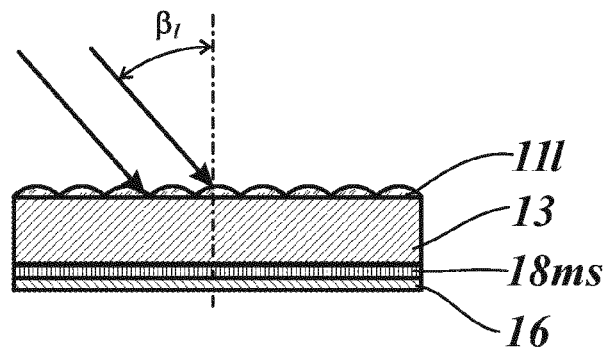
*Fig. 8.4*
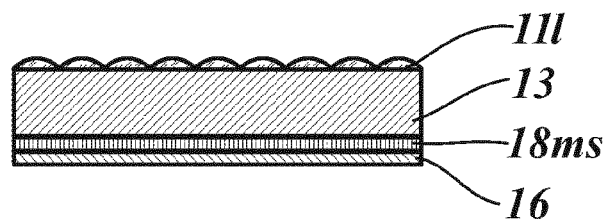
*Fig. 8.5*
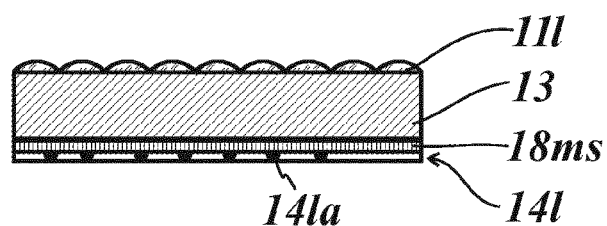
*Fig. 8.6*

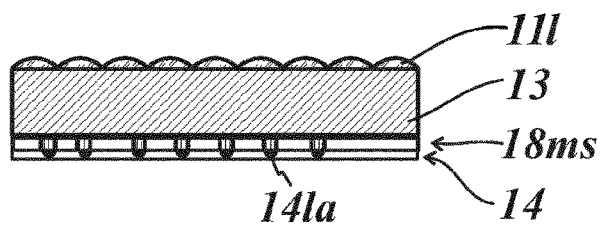
Fig. 8.7
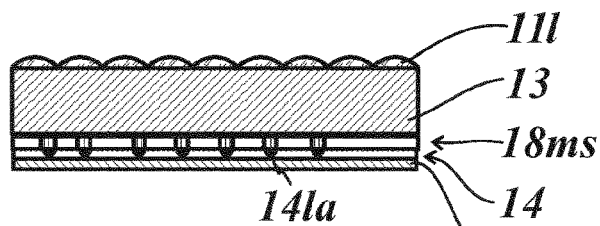
Fig. 8.8
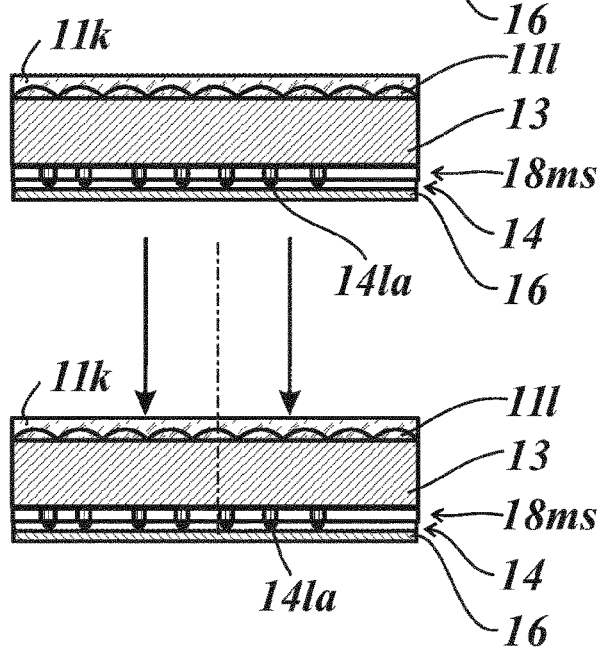
Fig. 8.9
Fig. 8.10
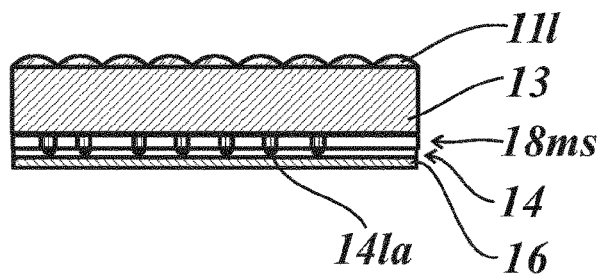
Fig. 8.11
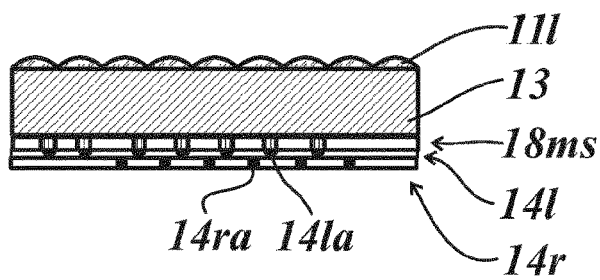
Fig. 8.12

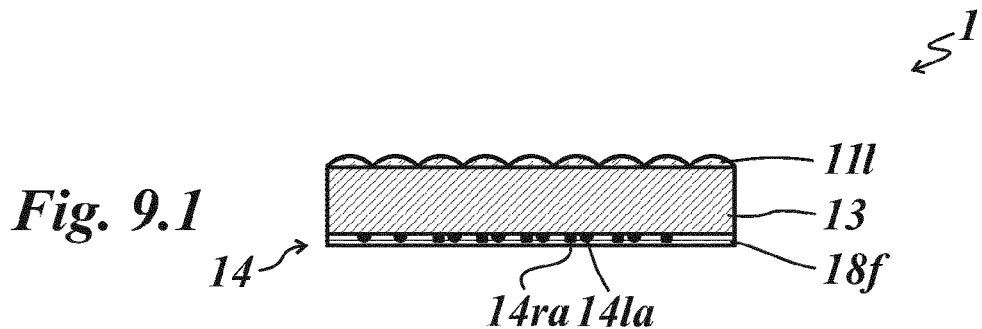
*Fig. 9.1*
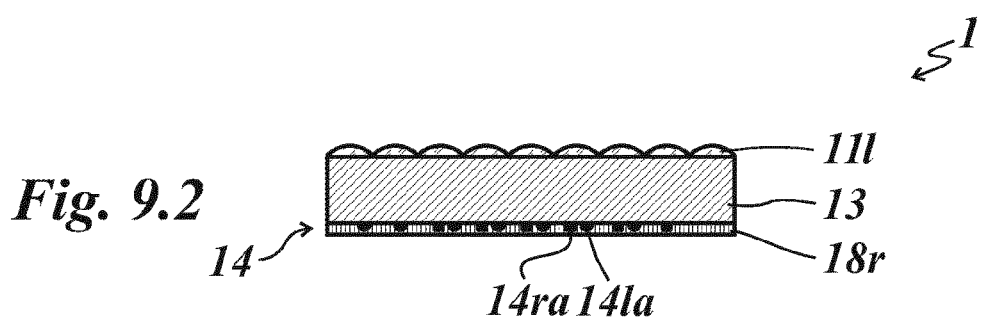
*Fig. 9.2*
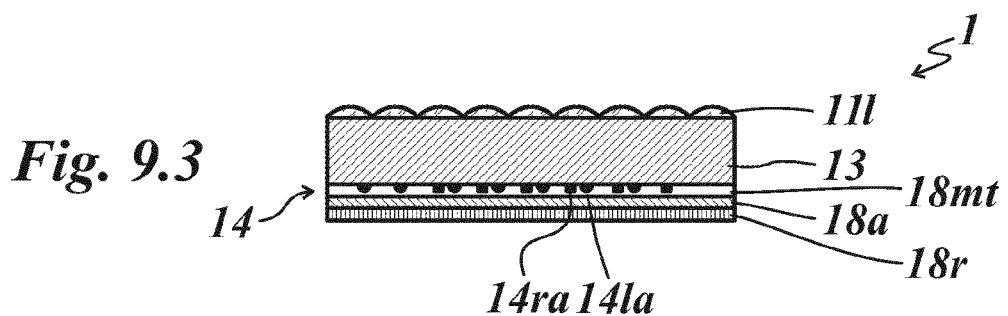
*Fig. 9.3*
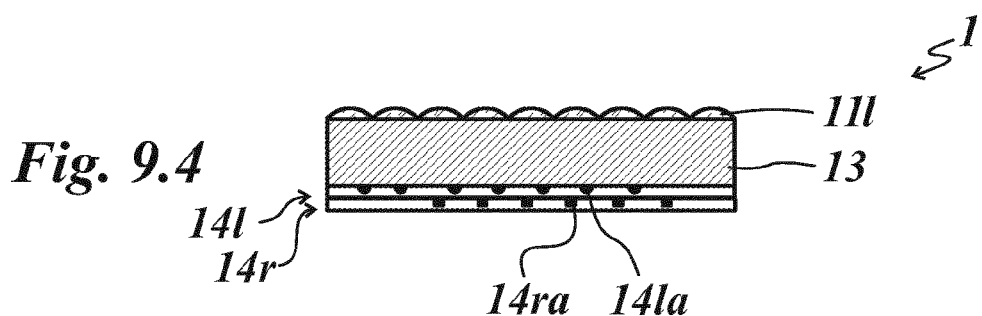
*Fig. 9.4*

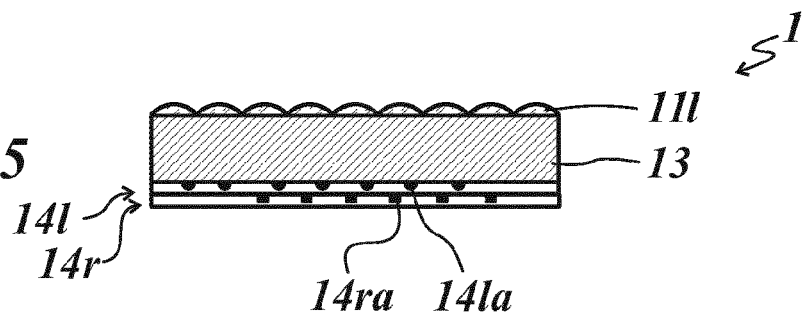
Fig. 9.5
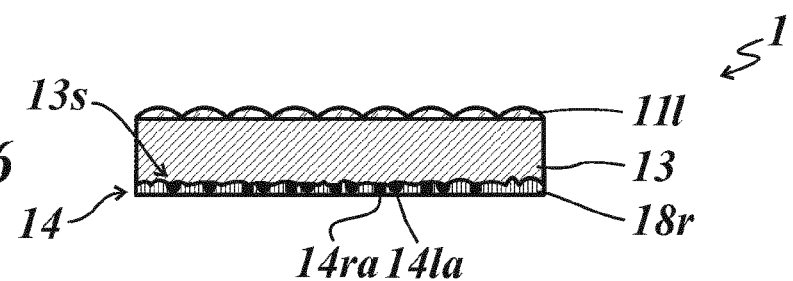
Fig. 9.6
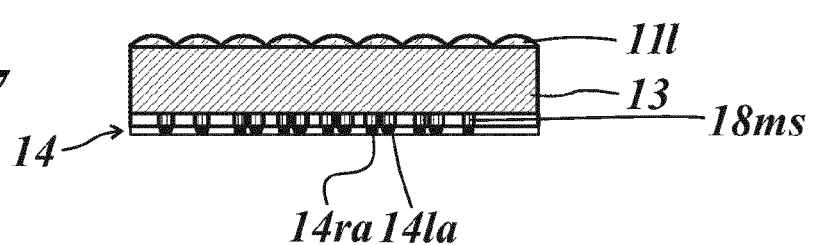
Fig. 9.7
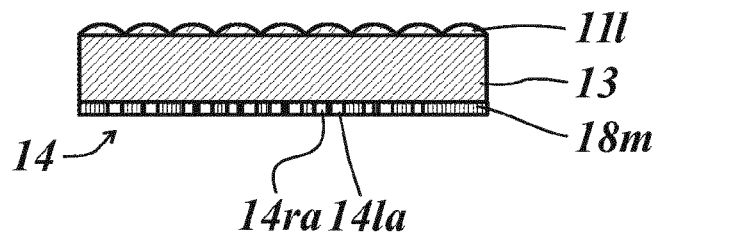
Fig. 9.8

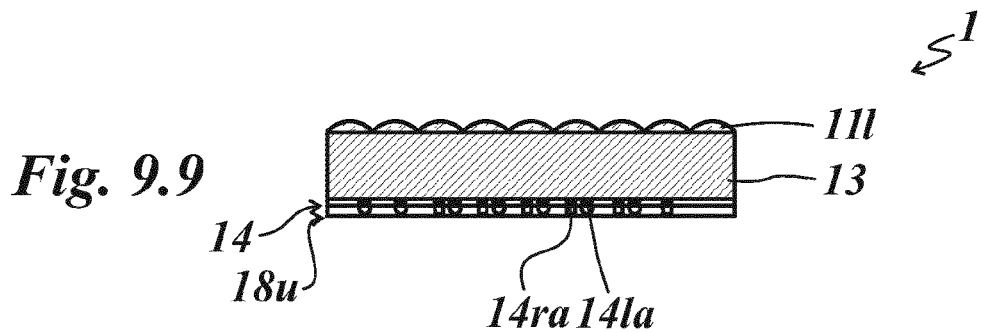
Fig. 9.9
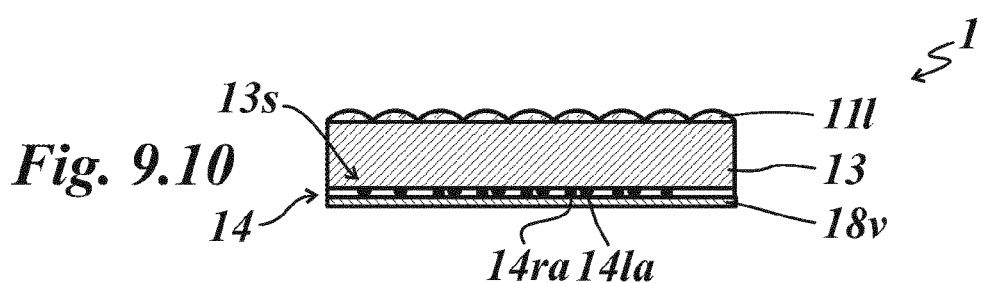
Fig. 9.10
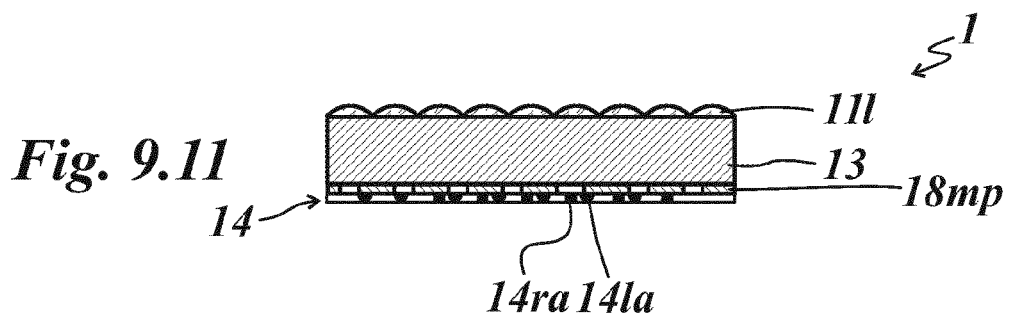
Fig. 9.11
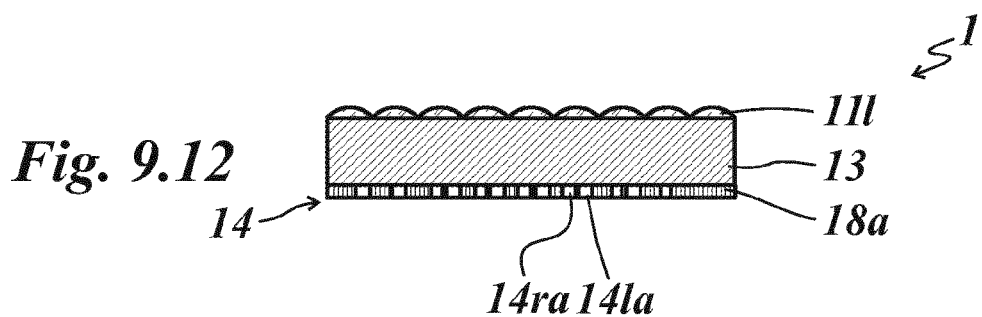
Fig. 9.12

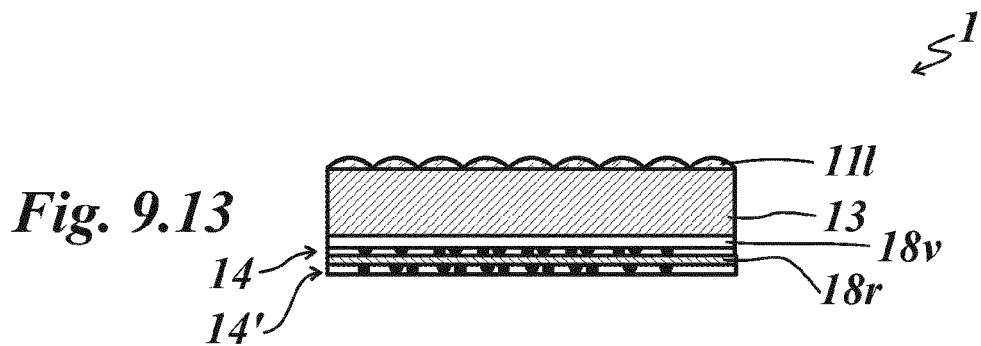
*Fig. 9.13*
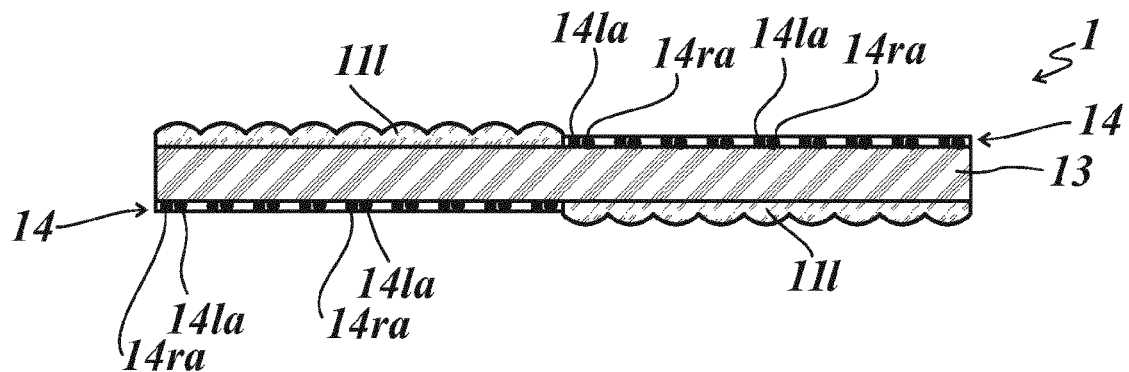
*Fig. 9.14*
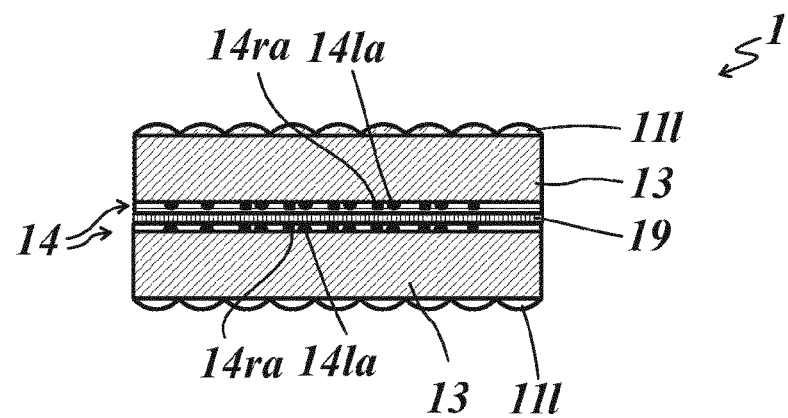
*Fig. 9.15*

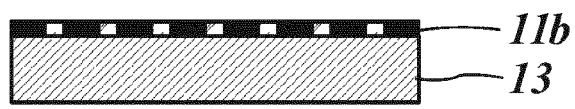
*Fig. 10.1*
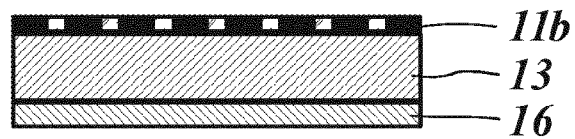
*Fig. 10.2*
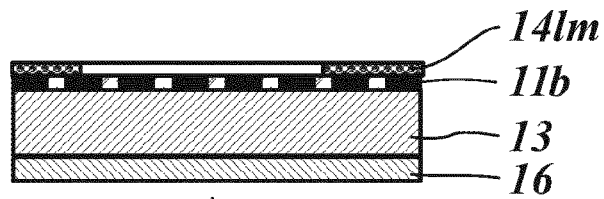
*Fig. 10.3*
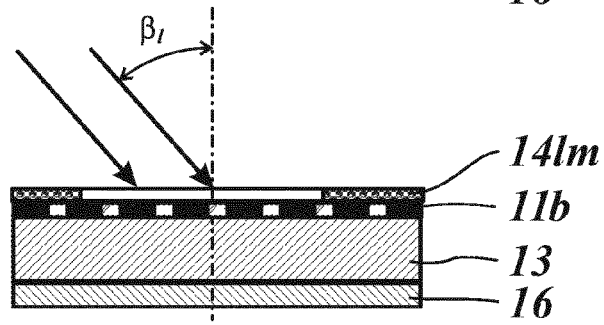
*Fig. 10.4*
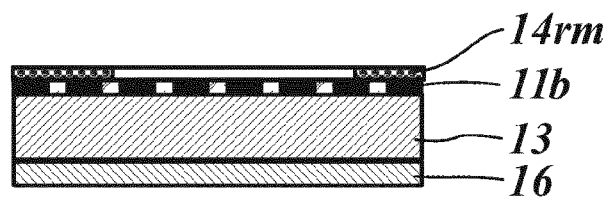
*Fig. 10.5*
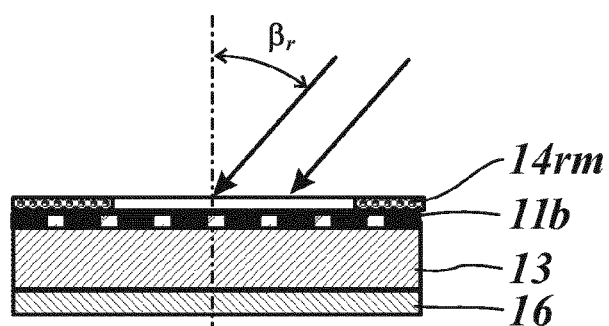
*Fig. 10.6*
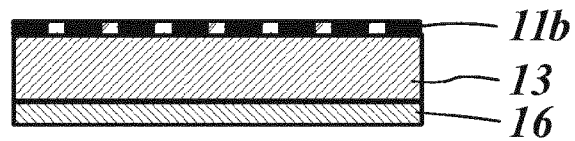
*Fig. 10.7*
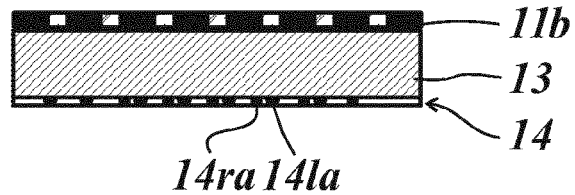
*Fig. 10.8*

*Fig. 11.1* 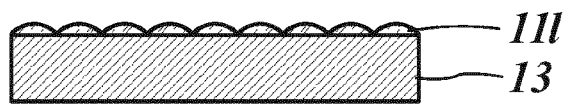
*Fig. 11.2* 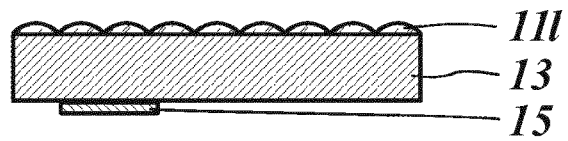
*Fig. 11.3* 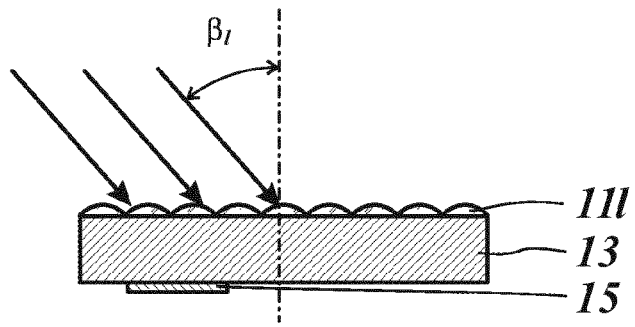
*Fig. 11.4* 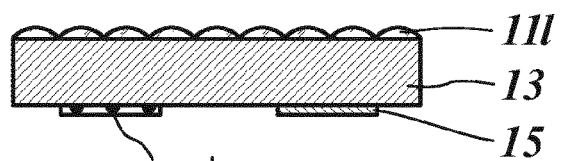
*Fig. 11.5* 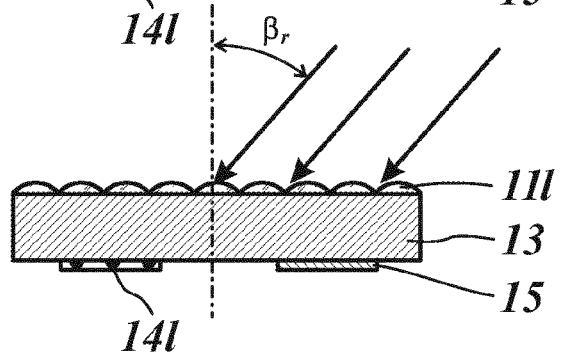
*Fig. 11.6* 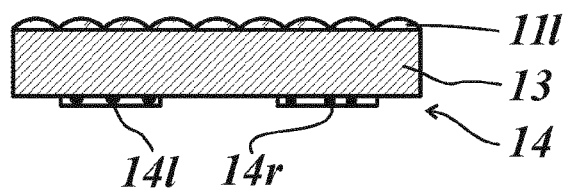
*Fig. 11.7* 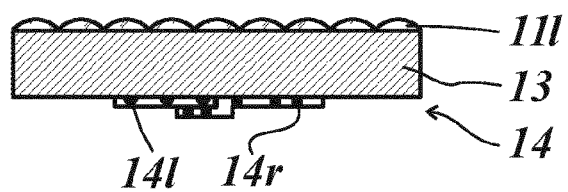

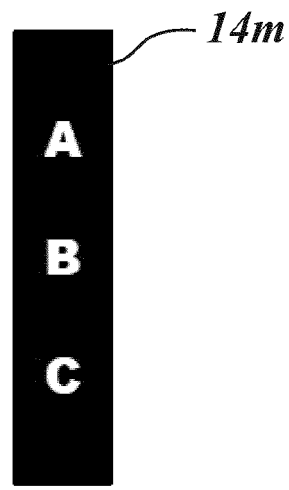
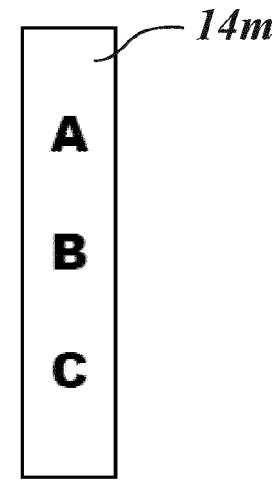
*Fig. 12*  *Fig. 13*
*Fig. 14a*  *Fig. 14b*  *Fig. 14c*

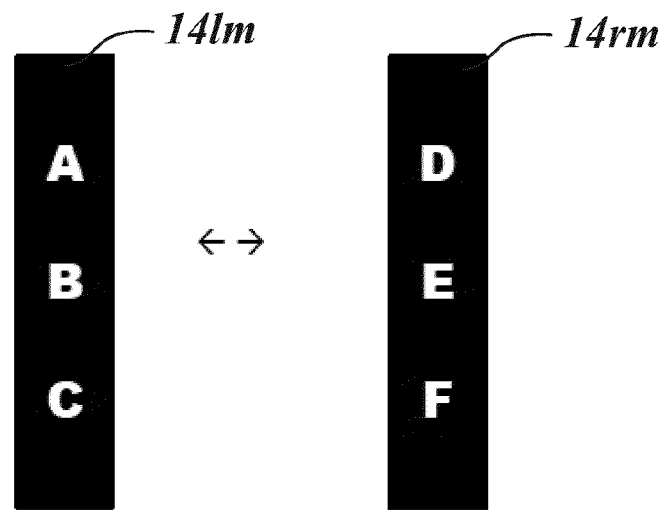
*Fig. 15a*  *Fig. 15b*
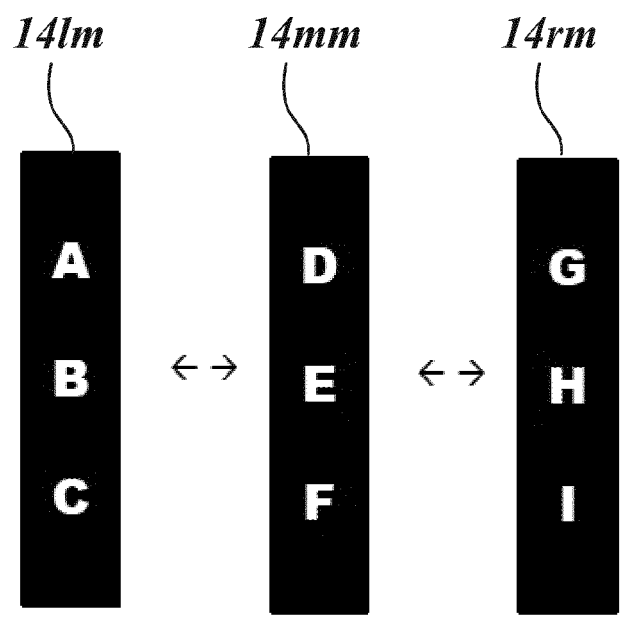
*Fig. 16a*  *Fig. 16b*  *Fig. 16c*

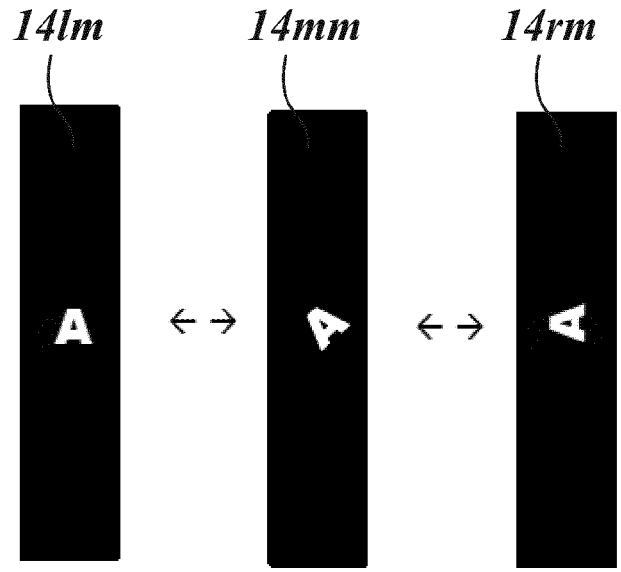
*Fig. 17a*  *Fig. 17b*  *Fig. 17c*
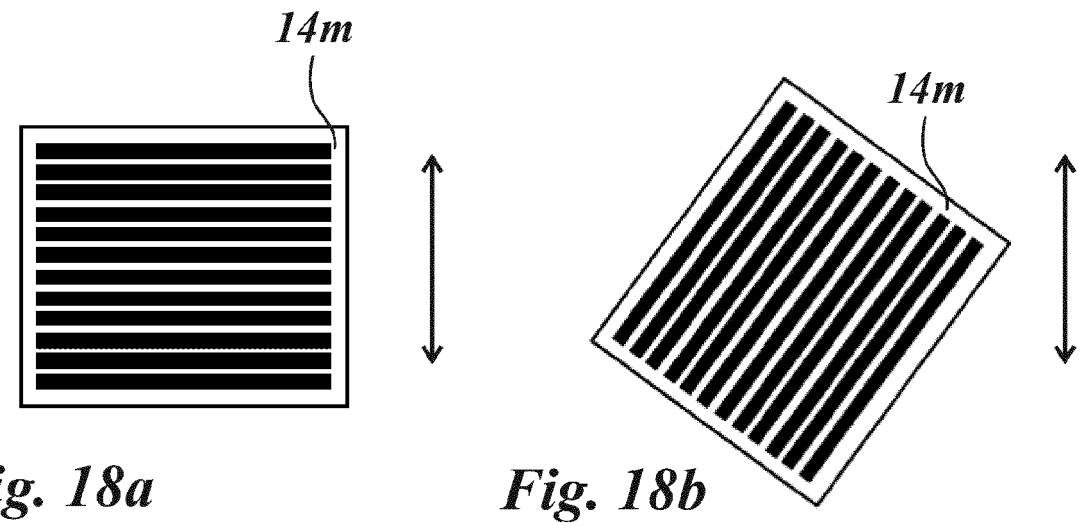
*Fig. 18a*  *Fig. 18b*
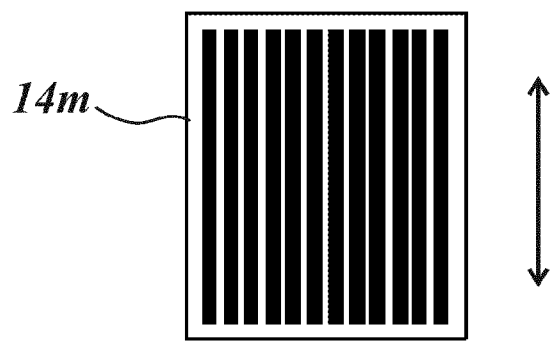
*Fig. 18c*

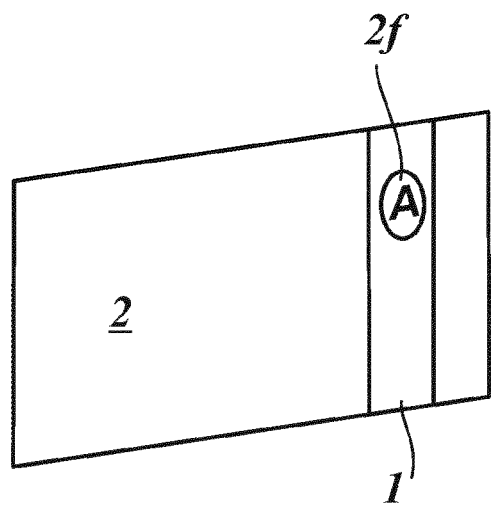
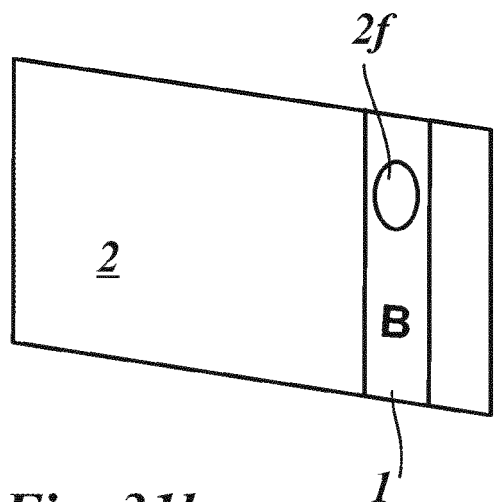
Fig. 31a          Fig. 31b
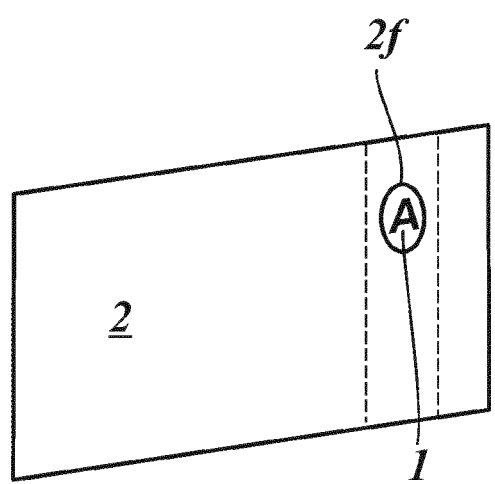
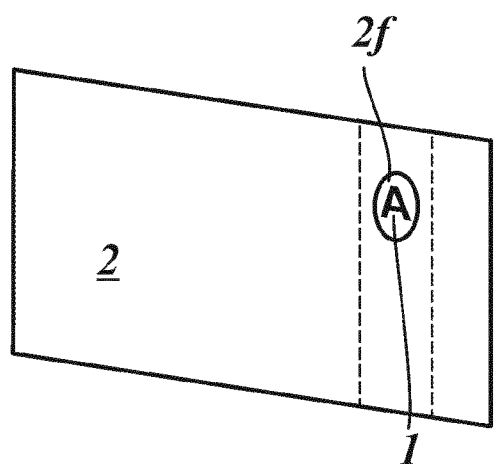
Fig. 32a          Fig. 32b

METHOD FOR PRODUCING SECURITY ELEMENTS HAVING A LENTICULAR FLIP

This application claims priority based on an International Application filed under the Patent Cooperation Treaty, PCT/EP2017/060931, filed May 8, 2017, which claims priority to DE102016109193.6, filed May 19, 2016.

BACKGROUND OF THE INVENTION

The invention relates to a method according to the preamble of claim 1 for producing security elements having a lenticular flip.

An optical element for the reproduction of images, which produces an image change by tilting about one or more tilt axes, is referred to as lenticular flip.

U.S. Pat. No. 6,016,225 A describes a security element formed as a lenticular flip, in which an array of microlenses is arranged over strip-shaped printed image information, wherein the accurate positioning of the image information relative to the optical elements is problematic.

SUMMARY OF THE INVENTION

The object of the present invention is to specify an improved method for producing a security element.

According to the invention this object is achieved with the subject of claim 1. A method for producing a security element comprising a micro-optical layer, wherein the micro-optical layer comprises an array formed from micro-optical systems, a carrier substrate and one image layer or several image layers is proposed, wherein the one image layer or the several image layers comprises or comprise n partial images for n=1 to i which are visible from an n-th observation angle allocated to the n-th partial image, and wherein n is at least 1, wherein it is proposed that the following method steps are provided:
a) providing the carrier substrate, on the upper side of which the micro-optical layer is formed;
b) applying a photoresist to the underside of the carrier substrate;
c) forming a latent n-th partial image in the photoresist, wherein an n-th master image is placed on the micro-optical layer and is exposed with parallel light beams incident at an n-th angle of incidence and an n-th incident azimuth, or
  wherein an n-th master image is projected onto the micro-optical layer with parallel light beams incident at an n-th angle of incidence and an n-th incident azimuth, or
  wherein the photoresist in step b) is applied in the form of an n-th master image to the underside of the carrier substrate and wherein the photoresist is exposed through the micro-optical layer with parallel light beams incident at an n-th angle of incidence and an n-th incident azimuth;
d) repeating method step c) until the i-th latent partial image is formed;
e) developing the photoresist to form the image layer.

The proposed method has the advantage that through the optical transfer of the i master images to the photoresist a plurality of design variants can be formed, wherein the photoresist can be selected in terms of its type (positive or negative), its color, its sensitivity and its development process.

A further advantage is that a very large number of variants can be formed using the proposed method, wherein relatively few process stages are necessary. The produced layer structure forms a "self-referencing system" which is very tolerant in the case of distortions, stretching and errors in the micro-optical systems.

By a micro-optical system is meant in particular an imaging optical system in which at least one dimension lies below the resolution of the naked human eye. The resolution here is dependent on the respective observation distance. An observation distance of approximately 250 mm would, for example, be typical for security applications. For this observation distance the dimension is smaller than approximately 300 µm.

The exposure is effected with virtually parallel beams in a range of angles of incidence. It can also be a larger range of angles of incidence. This leads to the corresponding partial image being recognizable in a larger observation angle range.

The terms "angle of incidence" and "observation angle" are each also intended to include a corresponding range around a specific angle, in particular a range ±10° around the respective angle of incidence or observation angle. The position of the observer can vary correspondingly here within the observation angle range.

The proposed method is further characterized in that no insetting is necessary, i.e. the image layer need not be introduced and/or applied in a positionally accurate manner relative to the micro-optical system.

The security element produced using the method has good interlayer adhesion, in particular due to its simple structure requiring few layers. It can therefore also be easily integrated in films with further security elements.

The method is also characterized by a high productivity.

The angles of incidence and the incident azimuth describe the spatial orientation of a projection beam striking the micro-optical layer. The angle of incidence is the vertical angle of the projection beam, relative to the normal to the micro-optical layer. The incident azimuth is the horizontal angle formed by projecting the projection beam onto the x-y plane.

The carrier substrate provided in method step a), on the upper side of which the micro-optical layer is formed, can be formed as a carrier film, as described further below. The micro-optical layer can also be a film which is formed, for example, as a self-supporting film. The micro-optical layer can be laminated onto or glued to the carrier film under the action of pressure and temperature and optionally after applying intermediate layers. The micro-optical layer can also be formed as a transfer ply of a transfer film, which is removed during or after the application of the micro-optical layer to the carrier film. The carrier film can temporarily also act as a protective film for the micro-optical systems, in order, for example, to prevent damage to the micro-optical systems in subsequent method steps. The carrier film can also have an optical function. Examples would be carrier films made of highly refractive materials or carrier films with polarizing or, in certain wavelength ranges, absorbent properties.

Method steps a) and b) can also be carried out in a modified sequence or also simultaneously. In the simplest case, the side lying opposite the micro-optical layer is coated with the photoresist. The coating can be effected over the whole surface or over part of the surface. For example, the photoresist can be applied in the form of a pattern or in the form of one or more motifs. Methods are coating, in particular printing from solution (solvent-containing; aqueous systems); solvent-free (liquid, semiliquid), or also applying so-called dry resists by rolling, gluing or laminating or also by transfer of a transfer ply from a carrier by means of hot stamping or cold stamping.

In accordance with the preferred use of a UV-sensitive photoresist, the wavelength of the light used in method step c) can lie in the UV range or in the near-UV range. Photoresists for the visual wavelength range are also available, for example in the spectral range of the spectral colors blue to green. These photoresists furthermore have the advantage that UV radiation is not required.

The photoresist can lie on different supports during the exposure process; for example, these can be dark (black, gray) or light (white) or transparent or translucent and/or metallic. They can be scattering or non-scattering. An exposure without support is likewise possible.

As method step c) is repeated (i–1) times until the i-th partial image is formed, it is possible to form two or more partial images in the image layer which are visible at different tilt angles of the security element or from different viewing directions, i.e. different observation angles. For example, the image layer can be formed with serial partial images, which create the illusion of movement when the security element is tilted. A further example is the transformation of a first image, optionally via intermediate stages, into a second image (morphing). Method step e) can include an additional exposure, optionally also at a wavelength other than in method step c), in order to further cure the image layer. A post-curing can also be effected by means of electron radiation (a so-called e-beam) and/or via a chemical cross-linking agent, in particular in the material of the photoresist. The prior application of a further layer is also possible in order to cure these together or in order to achieve a better adhesion between the layers.

In an advantageous embodiment, it is also possible for method step e) to be carried out before step d). In particular when the photoresist in step b) is applied in the form of an n-th master image to the underside of the carrier substrate and when the photoresist is exposed through the micro-optical layer with parallel light beams incident at an n-th angle of incidence and an n-th incident azimuth, it is possible to develop the respective photoresist after each step of the application. Alternatively, all the applied photoresist layers can be developed together.

For example, the method steps are carried out in the sequence: c) or d), then e) or also c), then e), then c) or d) and e) again. The sequence can also be b), then c) or d) and then e).

In preferred embodiments the carrier substrate can be formed as a carrier film, wherein the carrier film can be formed from several layers or layer composites. The carrier film can be a film made of a thermoplastic, for example polyethylene (PE), polypropylene, polycarbonate or polyester (PET, PETG) with a thickness of approximately 20 µm. A composite of various plastic plies, which are joined to each other, for example, by means of an adhesive, can also be used. The thickness of the carrier film typically ranges from 6 µm to 200 µm, preferably from 12 µm to 50 µm, further preferably from 16 µm to 36 µm. Semirigid or rigid substrates made of plastic, for example plastic plates made of PMMA, glass or glass-like materials, can also be provided as the carrier substrate.

It can be provided that the micro-optical systems in the array form a pattern formed as a security feature and/or as a decorative feature of the security element. For example, it can be provided that the distance between adjacent micro-optical systems is changed continuously or discontinuously or alternately. A repeating offset or distortion of the micro-optical systems can also be provided, for example after each thirtieth micro-optical system in a series an offset by half the length of the micro-optical system can be provided. Forgeries of the security element are made difficult by the fact that when the micro-optical layer and the image layer are copied, both have to be brought into a precise position relative to the pattern of the array. Also possible are statistical variations of the micro-optical systems, e.g. with respect to distance, position relative to each other and/or their shape.

It can further be provided that the micro-optical layer comprises differently formed arrays of micro-optical systems. The arrays can differ, for example, in their dimensions and/or the arrangement of the micro-optical systems.

The micro-optical system can be constructed from alternating transparent and opaque or partially opaque areas. In the simplest case, it can comprise line grids, which are e.g. printed on. However, it can also comprise more complex arrangements of transparent and opaque areas. Such line grids can also be arranged lamella-like for an effect similar to a venetian blind that is dependent on the viewing angle.

It can be provided that the micro-optical layer comprises a diaphragm layer which has transparent and opaque areas. The diaphragm layer can have, for example, alternating transparent and opaque strips and/or an array formed from pinhole diaphragms. The strips and/or the pinhole diaphragms can be formed as through-holes or as transparent areas in the micro-optical layer. As the transparency of a material is dependent on the frequency or the wavelength of an electromagnetic wave, the micro-optical layer can be nontransparent for light for example, but transparent for other wavelengths of the electromagnetic spectrum.

By "transparent" is meant a transmissivity of more than 50%, preferably more than 70%, further preferably of more than 90% in at least one partial region of the wavelength range visible to the human eye. By "opaque" is meant a transmissivity of less than 20%, preferably less than 5%, further preferably less than 1% in at least one partial region of the wavelength range visible to the human eye.

In a further advantageous embodiment, it can be provided that the micro-optical layer comprises an array formed from microlenses. The microlenses can be formed as spherical lenses, as aspherical lenses, as astigmatic lenses or as cylindrical lenses with a symmetrical or asymmetrical shape. Oval lenses, S-shaped lenses, circular curved lenses or lenses curved in another shape can be provided as further lens shapes. The lenses can be arranged relative to each other in different patterns, e.g. hexagonally. In the case of arrays with relatively large grid periods, the microlenses can also be formed as Fresnel lenses. Even though the imaging properties of Fresnel lenses may be worse than those of the above-named microlenses, the lower height of the Fresnel lenses can militate in favor of the use thereof. The microlenses can be arranged on the surface of the micro-optical layer or in recesses of the micro-optical layer. The micro-optical layer or areas of the micro-optical layer can also be arranged in recesses of a spacer layer. Substantially flat intermediate areas can be arranged between the microlenses, which should however be small in terms of the proportion of surface area. The intermediate areas can be minimized or eliminated by a corresponding arrangement of the microlenses relative to each other or by trimming the edge areas of the microlenses. It may be advantageous for the flat areas lying between the microlenses to be opaque or partially opaque. This can be achieved, for example, by colorings, overprints or a metallization. The flat areas can also have optical structures such as e.g. microstructures.

As an alternative to lenses, in special cases prisms as well as many other relief forms, such as trapezoids, etc. can also be used. In the case of trapezoids, the horizontal areas are preferably opaque. A combination of areas with different structures is also possible. These can be located next to each other as areas or can be gridded or interlaced in each other.

The upper side of the micro-optical layer can have, completely or partially, one or more additional layers, for example a relatively thin adhesive layer, which enables a better embedding of the security element formed e.g. as a security thread without limiting the optical functioning of the micro-optical systems disproportionately;

partial metal layers, which can be formed by demetallization or oblique sputtering;

partially overprinted, optionally colored varnishes with an optical refractive index identical or very similar to the micro-optical layer, in order to visually obliterate micro-optical systems in certain areas;

thin protective layers to increase the abrasion resistance of the micro-optical systems, wherein the protective layers can be formed, for example, from varnishes with nanoparticles;

micro-optical systems which, as described further below, are formed as lenses which have, for example, an optical refractive index of 2.0 can be coated with a protective layer or covering layer which has an optical refractive index of, for example, 1.5. Advantageously, the optical functioning of a thus-coated micro-optical layer cannot be copied by molding, for example galvanic molding.

The micro-optical layer formed as a lens layer can preferably be formed from a plastic. The plastics are usually thermoplastics or reactive systems. Examples of reactive systems are: radiation-curing systems, for example UV-curing systems, thermally reactive systems, for example epoxy resin curing-agent systems, catalytically curing systems, hybrid systems, etc. The starting materials can be liquid, semisolid, paste-like or solid. The use of thermoplastic elastomers is also possible. However, inorganic materials, such as for example glass, as well as combinations can also be used. The lens layer can also be dyed, for example through the addition of colored pigments and/or dyes, or can have an intrinsic color.

The microlenses can be produced corresponding to the state of the art by thermal molding (replication), UV replication, printing processes or lithographic processes.

It can be provided that the microlenses are formed with at least two different focal lengths. The image plane lies in the focus or close to the focus of the microlenses in the case of the above-named parallel beam path. Patterned areas can be formed in the array which have locally different orientation, for example 0° and 45°. The patterns comprised of microlenses could represent an additional macroscopic shape or an image. In dependence on the exposure angle and the shape of the microlenses, the respective focus can lie in different planes of the security element.

The microlenses can also have haptic properties.

It can be advantageous to use micro-optical systems in which the alignment of e.g. cylindrical lenses in two areas are arranged by 90° relative to each other. If the exposure is effected in the first and second area with an azimuth of 0° to the axis of the respective cylindrical lenses, during the respective tilting about the tilt axes, which are aligned with the longitudinal axes of the respective cylindrical lens in the first or in the second area, an image change (image flip) only becomes visible in each case in one area. In the other area in each case, the image would remain static.

It can be advantageous for the exposure in method step c) to be effected "defocused", with the result that the exposed areas, for example strips, are enlarged. The exposure is then effected, for example, in a particular range of angles of incidence. For example an increased observation angle range can hereby be realized, corresponding to the range of angles of incidence during the exposure. The security element is relatively tolerant with respect to the position of the photoresist. A certain tolerance with respect to the position of the photoresist in relation to the microlens foci is important in so far as variability in the microlens shape combined with a variation in the position of the focus can occur in the case of particular methods for producing the microlens layer, such as for example the gravure printing method.

It can further be provided that the micro-optical layer has two or more micro-optical systems arranged next to each other. The micro-optical systems can be arranged in the form of a pattern and/or one or more motifs.

In a further advantageous embodiment, it can be provided that the micro-optical layer has two or more micro-optical systems arranged in an x-y grid, wherein the x-axis of the x-y grid is arranged at an x-azimuth ($\alpha_l$) to the long side of the carrier substrate and the y-axis is arranged at a y-azimuth ($\alpha_q$) to the short side of the carrier substrate.

It can further be provided that the micro-optical systems are arranged in a distorted grid. By "a distorted grid" is meant a grid the longitudinal and transverse rows of which are not formed as straight lines.

In an advantageous embodiment, it can be provided that the micro-optical systems are formed as ball lenses. In a first example, the height of the ball lenses can be approximately 12 μm in the case of a grid period of the array of approximately 35 μm, a thickness of the micro-optical layer formed as lens layer in the range of from 20 μm to 25 μm and an overall thickness of the lens layer and of the carrier substrate in the range of from 35 μm to 40 μm. When the grid period named in the first example of approximately 35 μm is retained but with a thickness of the lens layer in the range of from 50 μm to 60 μm and an overall thickness of the lens layer and of the carrier substrate of approximately 70 μm, the ball lenses have a height of approximately 7 μm, that is to say are formed flatter.

It can be provided that the x-azimuth ($\alpha_l$) is equal to 90°.

In an advantageous embodiment, it can be provided that in method step b) a negative photoresist is applied. In order to form a positive image in the image layer the master image is to be formed as a negative image. The positive image and the negative image are characterized by the reversal of the brightness and/or the color of their pixels. By "a positive photoresist" is meant a resist in which the exposed areas are removed after development. Correspondingly, in the case of a negative photoresist the unexposed areas are removed. In the case of positive masks, the respective design elements are formed as transparent areas; in the case of negative masks, the design elements are opaque.

Depending on the subsequent process, the photoresist can be colorless or pigmented and/or dyed and/or can be printed multicolored. Dissolved dyes and/or pigments, also special pigments as are used in the security field, for example UV-fluorescent pigments, can be used as colorings. Pigments with small grain sizes below the layer thickness of the photoresist are preferred. So-called nanopigments, i.e. pigments with grain sizes below 1 μm, preferably below 0.5 μm, are further preferred. The pigments can be inorganic or organic in nature or can be mixtures of the two. In addition to insoluble pigments, soluble dyes can also be used.

The photoresist layer can be transparent, semitransparent or opaque, optionally opaque only in particular wavelength ranges. Thus the colored photoresist can be largely transparent, for example in the near-UV in which the photoresist is sensitive, but can appear substantially black in the visible wavelength range.

Liquid-crystalline materials in which, optionally additionally, spatial orientations of the liquid-crystalline molecules take place during the exposure process and/or curing process can also be used as photoresist. The orientation of the molecules can be adjusted e.g. on physical structures, such as for example microstructures, and/or through exposure by means of polarized light.

Alternatively, it can be provided that in method step b) a positive photoresist is applied. Positive and negative photoresists can also be used, e.g. in surfaces located next to each other. The exposure can be effected simultaneously or successively, optionally with a different radiation dose.

It can further be provided that in method step b) a microstructure is formed in the underside of the photoresist facing away from the carrier substrate or in the underside of the image layer facing away from the carrier substrate. The microstructure can be, for example, a hologram, an optical grating structure or the like. The spacer layer can likewise have an optical grating structure.

Further dependent claims are directed at applying further layers to the image layer after method step e).

It can be provided that after method step e) a single- or multilayered decorative layer is applied to the image layer.

It can also be provided that after method step e) one color layer or several color layers is or are applied to the image layer.

It can further be provided that after method step e) a metal layer or an HRI layer is applied to the photoresist or to the image layer. A layer which has a high optical refractive index (HRI=High Refractive Index) is referred to as an HRI layer. For example, ZnS or $TiO_2$ can be used for this purpose.

Further dependent claims relate to the formation of the image layer.

It can be provided that the image layer is formed as an etching mask and areas of the metal layer or of the HRI layer not covered by image areas of the image layer are removed by etching.

In an advantageous embodiment it can be provided that the image layer is used as "lift-off" layer. The term "lift-off" describes a method in which the image layer is formed as a mask to remove further layers located above the image layer.

The further layers can be, for example, metal layers which can be vapor-deposited or colored varnish layers which are coated flat, and which are structured in a washing process. The image layer has, in particular, a strongly pigmented and thereby porous or somewhat uneven varnish layer which is soluble in a solvent. The image layer is dissolved with an appropriate solvent such that the surface areas of the further layers located above are removed and openings in the further layers are thus produced.

It can further be provided that after method step e) a multilayer structure comprising, in particular in the viewing direction of the observer, a semitransparent metal layer as absorber layer, a spacer layer and a reflective metal layer is applied to the image layer. Such a multilayer structure can generate, in particular, optical color change effects dependent on the observation angle and/or illumination angle. The sequence of semitransparent metal layer and metal layer can also be changed.

In this case a color change effect is visible from the rear side.

In a further advantageous embodiment it can be provided that after method step e) the image layer is brought into contact with a transfer ply of a transfer film and the transfer ply is removed from the transfer film and transferred to the image layer, in particular only at the points where the image layer is located.

It can also be provided that after method step e) a volume hologram layer is applied to the image layer. This can occur by means of a transfer film as described above or by laminating or gluing on a volume hologram film.

In a further advantageous embodiment it can be provided that method steps b), c) and e) are performed with an n-th photoresist formed with an n-th color, and that method steps b), c) and e) are repeated (i−1) times, wherein i is at least 2.

It can also be provided that method step b), c) and e) are performed with an n-th photoresist (16) formed with an n-th color and/or an n-th sensitivity, and that method steps b), c) and e) are repeated (i−1) times, wherein i is at least 2.

The n photoresists can be applied to the underside of the carrier substrate as n layers arranged at least partially one above the other.

It can be provided that the n photoresists are applied to the underside of the carrier substrate as a pattern, in particular as a striped pattern, or also in the form of graphic motifs. As described further above, during the exposure the use of an exposure mask can be dispensed with.

It can further be provided that in method step c) the exposure is carried out with an n-th exposure level. The exposure with different exposure levels can, for example, influence the contrast of the partial images formed in the image layer.

It can further be provided that the image layer is formed from two partial images, that in method step c) the exposure is effected with a first incident azimuth, and that in method step d) the exposure is effected with a second incident azimuth, which differs by 90° from the first incident azimuth. The angle of incidence can likewise vary here.

It can also be provided that before method step b) a semitransparent metal layer is applied to the underside of the carrier substrate, that the photoresist is formed as an etch resist, and that, after method step e) is performed, the semitransparent metal layer is removed by etching in the areas not covered by the image layer.

The semitransparent metal layer can be formed with a transmittance in the range of from 1% to 95%, preferably in the range of from 5% to 70%.

In a further advantageous embodiment it can be provided that before method step b) a layer formed with a microstructure is applied to the underside of the carrier substrate or the underside of the carrier substrate is formed with a microstructure.

It can further be provided that the image layer is formed from a first and a second image layer, wherein the first image layer has a first partial image and the second image layer has a second partial image, that method step b) is performed with a first photoresist, that after method step c) method step e) is performed to form the first image layer, and that the following further method steps are performed:

f) applying a semitransparent reflective layer to the first image layer;

g) applying a second photoresist to the semitransparent reflective layer;

h) temporarily embedding the micro-optical layer, in so far as it comprises optical structures such as lenses, prisms, trapezoids, etc., in a compensation medium formed with the optical refractive index of the micro-optical systems;

i) exposing the second photoresist, wherein the first image layer forms an exposure mask;

k) developing the second photoresist to form a second image layer, which is formed as an etching mask;

l) etching the semitransparent reflective layer;

m) removing the compensation medium.

In an advantageous embodiment it can be provided that in method step c) the master image is formed as an electronically controllable display. A transmitted-light display can, for example, be provided, wherein it is possible in a simple manner to inscribe personalized items of information into the image layer in addition to static items of information. The personalized items of information can be formed as items of information readable by people and/or as machine-readable items of information. For the electronic control, a computer can be provided in which the personalized items of information are stored or can be input via an input device.

It can further be provided that in method step c) the parallel light beams projected onto the micro-optical layer are guided through filters and/or diaphragms before striking the micro-optical layer. Filters can be provided, for example, in order to filter out spectral components to which the photoresist is not sensitive. Filters or diaphragms can be used, in particular, before and/or after the parallelization of the light.

However, the light does not necessarily have to be parallel light. Thus a certain range of angles of incidence is allowed or even desired. In the case of cylindrical lenses, this is also dependent on the orientation of the range of angles of incidence with respect to the lens axis.

It can be provided that in method step a) a carrier substrate is provided, in which in a first area the micro-optical layer is formed on the upper side of the carrier substrate, and in which in a second area the micro-optical layer is formed on the underside of the carrier substrate, and that method steps b) to e) are carried out in the second area as in the first area, with the difference that in the second area the upper side of the carrier substrate forms the underside of the carrier substrate and vice versa. A security element is formed which can be arranged, for example, in a window of a security document, wherein different optical effects can be formed in the case of observation of the front side and of the rear side of the security element. It can also be provided to form the window in the security document such that it only enables the second area to be viewed. The first and/or the second area can have partial areas not connected to each other. For example, the partial areas can be formed as elements of a grid.

It can further be provided that the first area and the second area of the carrier substrate overlap each other in an overlap area. In this way, for example, a third security feature can be formed in the overlap area.

In a final method step it can be provided that a single- or multilayered adhesive layer is applied to the underside and/or upper side of the security element. Optionally, the underside and/or upper side of the security element can also have one or more additional layers, such as e.g. a bonding layer and/or a primer layer.

The security elements formed according to the above-described method can form many and varied optical effects.

It is possible to form stereoscopic effects when the two partial images of the image layer form a stereoscopic pair of images.

It is further possible to generate quasi-continuous movements of the images, wherein the movement, i.e. the positional change of the images, can occur when the observation position is continuously changed.

A morphing effect can be achieved in a similar way, wherein a first image is transformed via various stages into a second image.

The security elements 1 can be observed in reflection and/or in transmission.

The image layer or image layers can represent a static image on the side facing away from the micro-optical elements.

Following the production of the image layer further layers can be applied over the whole surface or partially, e.g. by printing or by transfer of a transfer ply from a carrier, in particular by hot stamping and/or cold stamping. A partial removal after the application, e.g. a so-called demetallization, is also possible. The layers can be metals, for example aluminum, HRI layers, colorless or dyed (e.g. dyed to complement the color of the image layer) single- or multi-ply plastic layers, primer layers of inorganic or organic nature, adhesive layers, etc. The sequence is as far as possible as desired. Layers can also appear several times. The application of further layers to the rear side of the image layer is of interest because different effects from the front and rear side can thus be realized.

By using several differently dyed photoresists, e.g. color images, in particular true color images, can be generated.

It is also possible to introduce optical structures into the image layer or into additional layers, e.g. by replication (thermal replication or UV replication). Optical structures can, however, also be introduced into a spacer layer before the image layer is applied.

The spacer layer can be a volume hologram layer.

Between the micro-optical layer and the image layer, a plurality of additional materials can be present, for example
dyed layers (over the whole surface or in areas)
pigmented layers (security pigments, for example UV-fluorescent pigments);
printed layers (over the whole surface or in areas);
layers which can be inscribed by means of a laser;
layers with polarizing properties;
HRI layers, for example made of ZnS.

The security elements can be formed with further elements which can serve, for example, as in particular static optical reference points, lines, etc. for the movement. Further elements could be additional Moiré elements, further printed or optically variable or metallic representations, which supplement or complement the image flip. The image flip represented can also be represented by one or more further technologies, for example by an optically variable element. Here, the image flip can be effected synchronously, asynchronously or inversely.

Elements of the image layer can also be used as markings, in particular as register marks and/or control marks for controlling further process steps, in particular for applying further layers and/or elements.

Combinations with further security elements or decorative elements can further be provided, which can be formed, for example, as a hologram, a Kinegram®, a lens effect, a volume hologram, security print, a decorative print, a UV-fluorescent print, a print of upconverters (IR upconverters), an OVI (Optically Variable Ink) print and as machine-detectable pigments (3rd line features). The combinations can be arranged next to each other. They can also be arranged interlaced in each other or overlapping. Image elements as well as data etc. contained therein can be complementary to each other, can supplement each other or can be repeated in various technologies.

The partial images contained in the image layer can be supplemented with further images or items of information of the security element. Thus the partial images of the image layer can present, with printed items of information outside the security element, an overall image or overall images. Here, a part of the overall image would be variable in particular through the lenticular flip.

Through a combination with an optically variable element, different overall partial images could be generated by partial items of information from lenticular flip and optically variable elements, which would be visible at different observation angles.

A further example would be the combination with an optically variable printing ink. Thus the colors of the optically variable ink, occurring at different observation angles, could be visible synchronously with the colors of the lenticular flip.

The security elements can provide additional functions such as machine-readability in addition to the optical effects. A lenticular flip or a Moiré magnifier can be machine-readable, wherein different barcodes or positive/negative barcodes can be displayed. These codes can be used for authentication/verification.

The image layer can contain a Moiré encoding, i.e. one or more images of the image flip can additionally be analyzed using a Moiré analyzer or via an image capture and processing. The capture of a Moiré effect can also be effected from the side facing away from the lenses.

A lenticular flip can contain Moiré magnifier information which is analyzed by a second analyzer, wherein the Moiré analyzer is positioned above the lens layer.

If, during the projection or during the exposure, a relatively large number of different partial images or different n partial images are formed, microimages with a slightly different pitch (distance of the image repetition) relative to the pitch of the array formed from micro-optical systems, preferably of the array formed from microlenses, particularly preferably of the array formed from a microlens grid, can be generated in the photoresist. When the security element is observed from different directions, in particular by rotating and tilting the security element, a continuous or quasi-continuous image sequence of the generated partial images can in particular be generated hereby. In particular when observing the security element, magnified images of the exposed n-th partial images or microimages are generated hereby, wherein when tilting or rotating the security element, design elements that are preferably moving and/or increasing in size and/or decreasing in size and/or reversed and/or rotating become visible. This is advantageously a 1D or 2D Moiré magnifier effect.

The exposure or the projection is preferably carried out in such a way that when the security element is observed from different observation directions, in particular by tilting and/or rotating, a continuous or quasi-continuous image sequence of the n-th partial images becomes visible.

It is also conceivable that the micro-optical layer comprises an array formed from microlenses or an array formed from microlens grids and the exposure or the projection is carried out in such a way that the n-th partial images are generated as microimages, as microimages distorted in 1 or 2 dimensions or as parts of microimages, whereby, in particular when the security element is observed from different observation directions, in particular by tilting and/or rotating, a continuous or quasi-continuous image sequence of the n-th partial images becomes visible.

Security elements produced according to the above-described method can be used, for example, in the following security documents or other security products or commercial products:
state or non-state personal documents (passport, identity card, visa, driver's license, birth certificate, motor vehicle license plate, gun licenses, etc.
banknotes, checks, certificates
credit cards; articles of value; tickets; access identity cards The security elements are in particular suitable in so-called documents with window technology with transparent areas for observation in transmitted light and/or observation from the front and rear side. So-called window banknotes can be banknotes with physical openings in the substrate or, for example, polymer banknotes with transparent polymer areas. The security elements 1 can partially or completely cover the window area, wherein an observation in the window area both from the front and the rear side of the banknote is possible in reflection and/or in transmission. In the case of polymer banknotes, the security element can also be constructed directly on the substrate, i.e. the polymer substrate would represent the carrier substrate.

The security element can likewise be part of a plastic card, wherein the security element is applied to a plastic card or is produced as an embedded and/or integral part of the plastic card.

The above-described elements can, however, also be used outside the field of security documents or outside the security field for decorative articles and advertising materials or as functional elements, for example as components of displays, light-guiding and illumination systems and spectacles.

The security elements are particularly suitable for products with so-called see-through elements, such as e.g. window banknotes, security thread applications for banknotes and/or documents with transparent areas, etc.

The security elements can be applied to objects or introduced (embedded) into objects.

BRIEF DESCRIPTION OF THE DRAWINGS

The invention is now explained in more detail with reference to embodiment examples. There are shown in:

FIGS. 2.1 to 2.3 embodiment examples of a lens layer in FIG. 1 in schematic top views;

FIGS. 3.1 to 3.5 method steps of an embodiment example for the provision of a carrier film, the upper side of which is formed as the lens layer in FIG. 1, in schematic sectional representations;

FIGS. 4.1 to 4.8 method steps of a first embodiment example of the first method according to the invention in schematic sectional representations;

FIG. 5.1 the method step in FIG. 4.4 in a schematic top view;

FIG. 5.2 the method step in FIG. 4.6 in a schematic top view;

FIGS. 6.1 to 6.6 method steps of a second embodiment example of the first method according to the invention in schematic sectional representations;

FIG. 7.1 a first embodiment example of an exposure device used to perform the method steps represented in FIGS. 4.4 and 4.6 in a schematic sectional representation;

FIG. 7.2 a second embodiment example of an exposure device used to perform the method steps represented in FIGS. 6.3 and 6.4 in a schematic sectional representation;

FIG. 7.3 a third embodiment example of an exposure device used to perform the method steps represented in FIGS. 6.3 and 6.4 in a schematic sectional representation;

FIGS. 8.1 to 8.12 method steps of a third embodiment example of the method according to the invention in schematic sectional representations;

FIGS. 9.1 to 9.15 embodiment examples of a security element produced according to the first or according to the second method in schematic sectional representations;

FIGS. 10.1 to 10.8 method steps of a fourth embodiment example of the method according to the invention in schematic sectional representations;

FIGS. 11.1 to 11.7 method steps of a fifth embodiment example of the method according to the invention in schematic sectional representations;

FIG. 12 a positive mask in schematic representation;

FIG. 13 a negative mask in schematic representation;

FIGS. 14a to 14c a first embodiment example of a mask;

FIGS. 15a and 15b a second embodiment example of a mask;

FIGS. 16a to 16c a third embodiment example of a mask;

FIGS. 17a to 17c a fourth embodiment example of a mask;

FIGS. 18a to 18c a first embodiment example of a diaphragm layer;

FIGS. 31a and 31b a fifth embodiment example of a security document;

FIGS. 32a and 32b a sixth embodiment example of a security document;

DETAILED DESCRIPTION OF THE PREFERRED EMBODIMENTS

Figure 1:
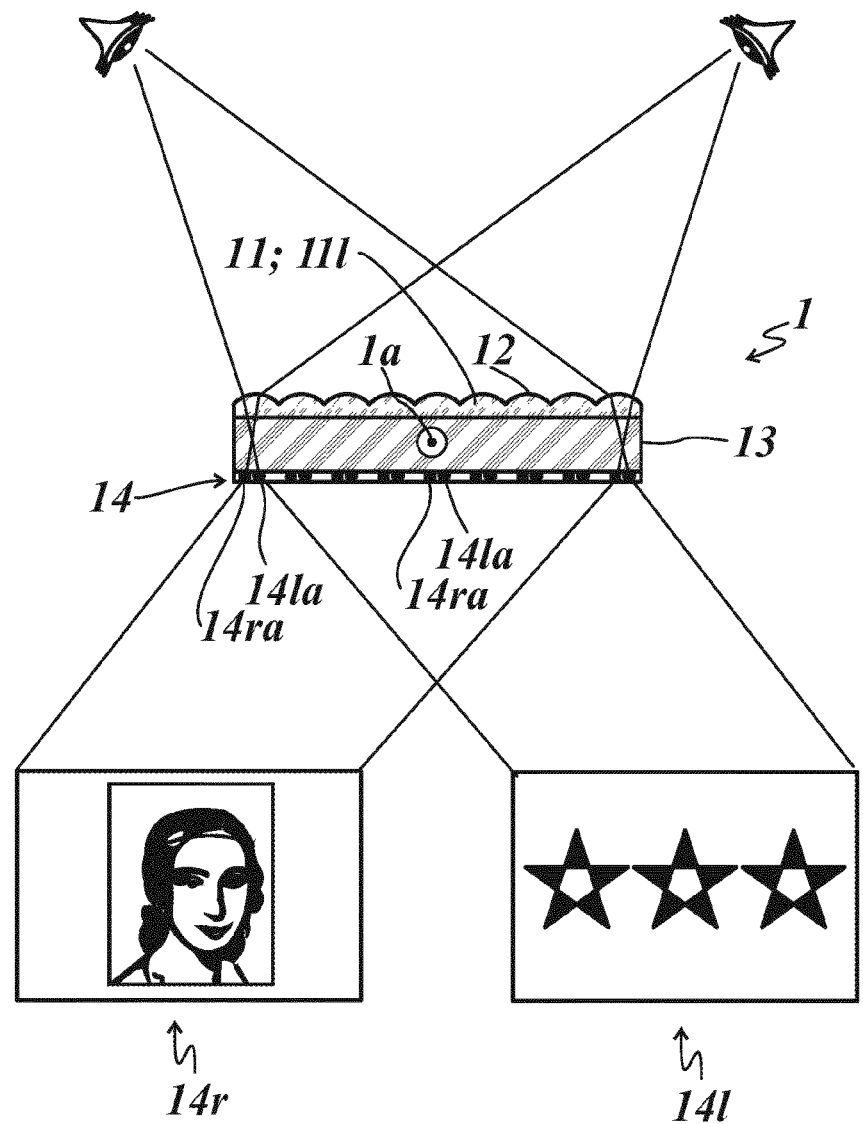
FIG. 1 a schematic diagram of the structure and functioning of a security element produced according to the first method according to the invention.

FIG. 1 shows a security element 1 comprising a micro-optical layer 11 formed as a lens layer 11*l*, a carrier film 13 and an image layer 14.

The lens layer 11*l* is arranged on the upper side of the carrier film 13. The lens layer 11*l* has a plurality of microlenses 12, which are arranged closely spaced in a grid. The microlenses 12 are not individually recognizable with the naked eye from an observation distance of approximately 250 mm, when the grid period is less than approximately 300 μm. In the embodiment example represented in FIG. 1, the grid period is approximately 35 μm.

In the embodiment example represented in FIG. 1, the microlenses 12 are formed as cylindrical lenses or as spherical lenses or as ball lenses, which are arranged on the surface of the lens layer 11*l*. The microlenses 12 can also be formed as aspherical lenses.

The image layer 14 is arranged on the underside of the carrier film 13 and lies in the image plane of the microlenses 12. The image plane lies in the focus or close to the focus of the microlenses 12. In the embodiment example represented in FIG. 1, the image layer 14 comprises two partial images 14*l* and 14*r* which in the case of cylindrical lenses are screened in strip-shaped image sections 14*la* and 14*lr*, wherein the image sections 14*la* and 14*lr* are arranged alternately and in register-accurate manner underneath the microlenses 12. In the case of ball lenses, "dots" form underneath the lens, which are lined up next to each other. With the named grid period of 35 μm the image sections 14*la* and 14*lr* have a width of typically less than 17.5 μm, in particular a width of from 3 μm to 10 μm. When the security element 1 is tilted about a tilt axis 1*a* which is aligned with the longitudinal axes of the image sections 14*la* and 14*ra*, an image change occurs, i.e. depending on the observation direction either the partial image 14*l* or the partial image 14*r* is visible. Between the image areas there may also be positions in which none of the images is visible. The tilt axis need not be precisely aligned with the image sections in order to recognize an image change. Thus even in the case of clear deviations, for example in the case of an angular deviation of 30°, an image change becomes visible.

In the embodiment example represented in FIG. 1, the partial image 14*l* depicts star-shaped symbols, and the partial image 14*r* a portrait. Such security elements are referred to as lenticular flip or image flip.

The partial images 14*l* and 14*r* are macroimages, i.e. the partial images 14*l* and 14*r* have the same or approximately the same size as the partial images visible during observation.

The dimensions of the layer structure are dependent on the optical arrangement of the lenses as well as the optical properties of the spacer layer. Here, the optical refractive indices of the materials used are an important parameter.

With the grid period named further above of approximately 35 μm, a thickness of the lens layer 11*l* in the range of from 20 μm to 25 μm and an overall thickness of the lens layer 11*l* and of the carrier film 14 in the range of from 35 μm to 40 μm, the microlenses 12 have a height of approximately 12 μm.

With the grid period named further above of approximately 35 μm, a thickness of the lens layer 11*l* in the range of from 50 μm to 60 μm and an overall thickness of the lens layer 11*l* and of the carrier film 14 of approximately 70 μm, the microlenses 12 have a height of approximately 7 μm.

FIG. 2.1 shows a first embodiment example of the lens layer 11*l*. The lens layer 11*l* has microlenses formed as cylindrical lenses 12*z*, the longitudinal axes of which are aligned with the tilt axis 1*a*.

FIG. 2.2 shows a second embodiment example of the lens layer 11*l*. The lens layer 11*l* has microlenses formed as ball lenses 12*k*, which are arranged in longitudinal rows and transverse rows adjoining each other, wherein the longitudinal axes of the transverse rows are aligned with the tilt axis 1a.

FIG. 2.3 shows a third embodiment example of the lens layer 11l. The lens layer 11l is formed like the lens layer 11l described in FIG. 2.2, with the difference that the longitudinal axes of the transverse rows 12r adjoining each other form an azimuth $\alpha_q$ with the tilt axis 1a, and that the longitudinal axes of the longitudinal rows 12l adjoining each other form an azimuth $\alpha_l$ with the tilt axis 1a. The azimuth denotes a horizontal angle in the x-y plane of the lens layer 11l. In the embodiment example represented in FIG. 2.3, the azimuth $\alpha_q=45°$, the azimuth $\alpha_l=135°$.

Combinations of microlenses 12 with a different alignment can thus also be used for design purposes. The range of variation of the azimuth is in this respect important in cases where more complicated lens shapes or lens arrays are used.

In one embodiment example, FIGS. 3.1 to 3.5 show a method for forming the lens layer 11l arranged on the carrier film 13. The method is described in the following as a roll-to-roll method.

Alternative methods are, for example, roll-to-sheet methods or sheet-to-sheet methods. Individual production of the security elements is also possible.

FIG. 3.1 shows a first method step in which the carrier film 13 is provided. The carrier film 13 can be a film made of a thermoplastic, for example polyethylene, polypropylene, polycarbonate or polyester (PET) with a thickness of approximately 20 μm, which is rolled up on a supply roll. A composite of various plastic plies which are joined to each other, for example, by means of an adhesive can also be used. The thickness of the carrier film typically ranges from 6 μm to 200 μm, preferably from 12 μm to 50 μm, further preferably from 16 μm to 36 μm.

FIG. 3.2 shows a second method step in which the upper side of the carrier film 13 is coated with a replication layer 15 made of a varnish that cures under UV light. The coating can be effected in a coating station which the carrier film 13 is guided past. The coating can be effected from a solution or solvent-free, optionally at increased temperatures. Between the layers 11 and 13 further optional single- or multilayered layers such as for example an adhesion-promoter layer or a blocking layer or barrier layer can also be provided.

FIG. 3.3 shows a third method step in which a stamping die 15s is pressed onto the replication layer 15. The underside of the stamping die 15s facing the replication layer 15 has a surface structure which corresponds to the negative of the surface structure of the lens layer 11l. The stamping die 15s is formed as a stamping roller, wherein the carrier film 13 coated with the replication layer 15 is pressed onto the stamping roller using a pressure roller.

FIG. 3.4 shows a fourth method step in which the stamped replication layer 15 arranged on the carrier film 13 is guided past a UV radiation source, with the result that the replication layer bonds to the lens layer 11l.

Alternatively, the UV exposure can also be effected from the carrier side through the carrier film 13. A further variant is a UV exposure during the stamping process, i.e. while the stamping die 15s and the replication layer 15 are in contact such that the structure of the stamping die 15s is molded into the replication layer 15. The stamping die 15s can be formed flat, semicircular or round depending on the method used. The UV exposure can also be effected under a protective-gas atmosphere. Here, e.g. a nitrogen atmosphere or an argon gas atmosphere is generated above the replication layer 15, in order to largely exclude oxygen during the exposure.

In the exposure method, particular effects can also be compensated for in advance. For example, the final product could be used on a curved surface. For this purpose, e.g. the replication layer 15 would be carried on a curved surface during the exposure process.

Alternatively, the precompensation can be effected by adapting the local exposure direction. Here, the local exposure angle is modified. This can also be effected by interposition of an optical lens system with one or more optical lenses, through which the local exposure turns out differently. The precompensation can alternatively or additionally also be effected by modifying the exposure masks. The precompensation can also be effected corresponding to a mathematical function.

FIG. 3.5 shows a fifth method step in which the carrier film 13 coated with the lens layer 11l is in the form of a semifinished product which is wound onto a take-up reel according to the above-described roll-to-roll method.

It can also be provided to form the replication layer 15 as a plastic layer and to stamp the lens structure directly into the replication layer 15. Thus the fourth method step represented in FIG. 3.4 is dispensed with. The replication layer preferably comprises thermoplastics or varnishes. Thermoplastic elastomers can also be used.

It can also be provided to print the lens layer 11l onto the carrier film 13 instead of the method steps represented in FIGS. 3.2 to 3.4.

It can further be provided to form the lens layer 11l in one piece with the carrier film 13 and to stamp the lens layer 11l into the carrier film 13. Alternatively a separately produced lens layer, with lenses already formed, can also be applied to the carrier film, for example by means of gluing.

FIGS. 4.1 to 4.8 show a first embodiment example of the first method according to the invention, in which the image layer 14 is formed in a contact process with a first image 14l and a second image 14r, as described further above in FIG. 1. FIGS. 4.1 to 4.8 are schematic sectional representations, wherein, for a better overview, layers are each represented as a rectangular area.

FIG. 4.1 shows a first method step in which the carrier film 13, on the upper side of which the lens layer 11l is formed, is provided. The structure of the lens layer 11l is described further above.

FIG. 4.2 shows a second method step in which a photoresist 16 is applied to the underside of the carrier film 13. Typical starting materials for photoresists 16 are, for example, polymethyl methacrylate, novolak, polymethyl glutarimide and epoxy resins. Common solvents are, for example, cyclopentanone or gamma-butyrolactone photoresists 16 as a rule additionally contain a photosensitive component. Water-soluble photoresists 16 can also be used.

The method steps of applying the photoresist 16 and applying or introducing the microlenses can also be carried out in a modified sequence or also simultaneously. The coating with the photoresist 16 can be effected over the whole surface or over part of the surface. For example, the photoresist can be applied in the form of a pattern or in the form of one or more motifs. Methods are coating or printing from solution (solvent-containing; aqueous systems); solvent-free (liquid, semiliquid), or also applying so-called dry resists by rolling, gluing.

Positive photoresists 16 and/or negative photoresists 16 can be used.

Depending on the subsequent process, the photoresist 16 can be colorless or pigmented and/or dyed and/or can be printed multicolored. Dissolved dyes and/or pigments, also special pigments as are used in the security field, for example UV-fluorescent pigments, are used as colorings. Pigments with small grain sizes below the layer thickness of the photoresist 16 are preferred. So-called nanopigments, i.e. pigments with grain sizes below 1 µm, preferably below 0.5 µm, are further preferred. The pigments can be inorganic or organic in nature or can be mixtures of the two. In addition to pigments, soluble dyes can also be used.

The photoresist 16 can be transparent, semitransparent or opaque, optionally opaque only in particular wavelength ranges. Thus the colored photoresist can be largely transparent, for example in the near-UV in which the photoresist is sensitive, but can appear substantially black in the visible wavelength range. Liquid-crystalline materials can also be used as photoresists, in which, optionally additionally, spatial orientations of the liquid-crystalline molecules take place during the exposure process or curing process. The orientation of the molecules can be formed e.g. on physical structures, such as e.g. microstructures, and/or also through exposure by means of polarized light.

The photoresists 16 can be applied colorless or single-colored or multicolored. They can also be applied in the form of one or more patches. The patch shape can likewise represent a motif and/or a pattern, for example a country outline, and/or can be interrupted, for example can be formed strip-shaped. Photoresists 16 can also be applied multilayered. The layers can have different forms and/or properties.

FIGS. 4.3 and 4.4 show a third method step in which a first master image 14lm formed as an image mask is placed on the lens layer 11l (FIG. 4.3) and the photoresist 16 is exposed through the lens layer 11 with parallel light beams at a first angle of incidence $\beta_l$, which is equal to a first observation angle (FIG. 4.4). A first latent partial image is formed in the photoresist 16 by the exposure. FIG. 5.1 shows the third method step in top view. The master image 14lm can be formed as a positive mask (see FIG. 12) or as a negative mask (see FIG. 13).

FIGS. 4.5 and 4.6 show a fourth method step in which a second master image 14rm formed as an image mask is placed on the lens layer 11 (FIG. 4.5) and the photoresist 16 is exposed through the lens layer 11 with parallel light beams at a second angle of incidence $\beta_r$, which is equal to a second observation angle (FIG. 4.6). A second latent partial image is formed in the photoresist 16 by the exposure.

FIG. 5.2 shows the fourth method step in top view. The angle $\beta_r$ here can also be 0°.

The parallel light beams used in the third and fourth method steps are produced in an exposure device 17 schematically represented in FIG. 7.1. The exposure device 17 comprises a radiation source 17l and a projection objective lens 17o. The radiation source 17l is a lamp which emits light in the near-UV range or in the UV range. The wavelength of the light is matched to the properties of the photoresist 16. The radiation source 17l is arranged in the focus of the projection objective lens 17o, with the result that parallel light beams exit the projection objective lens 17o.

In principle, all suitable methods for producing parallel light or virtually parallel light can be used. These also include the use of lasers or laser diodes, optionally in combination with suitable optics.

FIGS. 4.7 and 4.8 show a fifth method step in which the exposed photoresist 16 is developed to form the image layer 14. During the development, for example, the unexposed areas of the photoresist 16 are removed, for example by washing-off with a solvent.

The exposed areas of the photoresist 16 are chemically altered by the action of the light beams such that their solubility is lower than the solubility of the exposed areas. Typical developer solutions are e.g. alkali-containing solutions. Residues of the developer solution are subsequently removed in corresponding post-treatment processes, e.g. washing with deionized water. The removal of the photoresist can be facilitated by sponges, brushes, high-pressure nozzles, etc. Organic solutions or solvents can also be used as developer solutions. There are also photoresists which use essentially water as developer solutions. Additives in the developer solution, such as for example isopropanol, serve for better wetting of the photoresist. In FIG. 4.8, the image layer 14 which comprises the partial images 14l and 14r is represented.

After the development process, an additional UV exposure, optionally also at another wavelength, can be effected in order to further cure the image layer 14. A post-curing can also be effected by means of electron radiation (e-beam) and/or via a chemical cross-linking agent and/or by a post-treatment at increased temperatures. The prior application of a further layer is also possible in order to cure these together or in order to achieve a better adhesion between the layers.

It is also possible to provide more than two exposure directions, for example three exposure directions.

FIGS. 14a to 14c show master images suitable for this, which are formed as positive masks.

FIG. 14a shows a first master image 14lm, FIG. 14b a second master image 14mm and FIG. 14c a third master image 14rm. The master images 14lm, 14mm and 14rm are each exposed from different angles. When a thus-formed security element is observed, three partial images appear successively, the motifs of which are symbolized by the letters A, B, C, which are in each case visible only at the allocated tilt angle.

FIGS. 15a and 15b show a further embodiment example for master images 14lm, 14rm. When a thus-formed security element is observed, two partial images appear during tilting, the motifs of which are symbolized by the letters A, B, C and D, E, F, which are in each case visible only at the allocated tilt angle.

FIGS. 16a to 16c show an embodiment example which is formed like the embodiment example described in FIGS. 14a to 14c, with the difference that when a thus-formed security element is observed, three partial images appear successively, the motifs of which are symbolized by the letters A, B, C-D, E, F-G, H, I.

FIGS. 17a to 17c show an embodiment example which is formed like the embodiment example described in FIGS. 14a to 14c, with the difference that when a thus-formed security element is observed, three partial images appear successively, the motifs of which are symbolized by the letter A, which changes its rotational position.

FIGS. 6.1 to 6.6 show a second embodiment example of the first method according to the invention, in which the image layer 14 is formed in a projection method with a first partial image 14l and a second partial image 14r, as described further above in FIG. 1. FIGS. 6.1 to 6.6 are schematic sectional representations, wherein, for a better overview, layers are each represented as a rectangular area.

FIG. 6.1 shows a first method step in which the carrier film 13, on the upper side of which the lens layer 11*l* is formed, is provided. The structure of the lens layer 11*l* is described further above.

FIG. 6.2 shows a second method step in which a photoresist 16 is applied to the underside of the carrier film 13.

FIG. 6.3 shows a third method step in which a first master image 14*lm* is transferred by a parallel projection onto the lens layer 11 and is focused by the microlenses 12 of the lens layer 11*l* on the photoresist 16. The projection beams strike the lens layer 11*l* at a first angle of incidence $\beta_l$, which is equal to a first observation angle. A first latent partial image is formed in the photoresist 16 by the exposure.

FIG. 6.4 show a fourth method step in which a second master image 14*rm* is transferred onto the lens layer 11*l* by a parallel projection. The projection beams pass through the lens layer 11*l* at a second angle of incidence $\beta r$, which is equal to a second observation angle. A second latent partial image is formed in the photoresist 16 by the exposure.

The parallel light beams used in the third and fourth method steps are produced in an exposure device 17 schematically represented in FIG. 7.2. The exposure device 17 comprises a radiation source 17*l*, a condenser lens 17*k*, a holder 17*a* for the master image 14*lm*, 14*rm* and a projection objective lens 17*o*. The radiation source 17*l* is, for example, a lamp which emits light in the near-UV range or in the UV range. The wavelength of the light is matched to the properties of the photoresist 16.

During projection, the master image 14*lm*, 14*rm* which can comprise one or more images, patterns, etc. is projected via the projection objective lens 17*o* from a defined position relative to the lens layer 11*l*, wherein the projection objective lens 17*o* and the microlenses 12 form an optical system in which a parallel beam path is formed between the projection objective lens 17*o* and the microlenses 12. Both a 1:1 imaging and a magnification and/or reduction in size of the master image 14*lm*, 14*rm* can be effected.

If, during the projection or during the exposure, a relatively large number of different partial images or different n partial images 14*l*, 14*r* are formed, microimages with a slightly different pitch (distance of the image repetition) relative to the pitch of the array formed from micro-optical systems, preferably to the pitch of the array formed from microlenses 12, particularly preferably to the pitch of the array formed from a microlens grid, can be generated in the photoresist 16. When the security element 1 is observed from different directions, in particular by rotating and tilting the security element 1, a continuous or quasi-continuous image sequence of the generated partial images 14*l*, 14*r* can in particular be generated hereby. In particular when observing the security element 1, magnified images of the exposed n-th partial images 14*l*, 14*r* or microimages are generated hereby, wherein when tilting or rotating the security element 1, design elements that are preferably moving and/or increasing in size and/or decreasing in size and/or reversed and/or rotating become visible. This is advantageously a 1D or 2D Moiré magnifier effect.

The exposure or the projection is preferably carried out in such a way that when the security element 1 is observed from different observation directions, in particular by tilting and/or rotating, a continuous or quasi-continuous image sequence of the n-th partial images 14*l*, 14*r* visible.

Both analog and digital methods can be provided as methods for generating the master image 14*lm*, 14*rm*. The master image 14*lm*, 14*rm* can be formed, for example, as a mask. The mask can consist, for example, of a metallic diaphragm with apertures or of a film material, which has been correspondingly blackened. The use of masks with partial images is of interest, in which the respective partial images (openings) have a selective transparency for certain wavelengths, for example a transparency for UV-A or UV-B. By using two UV exposure units with different wavelengths or wavelength ranges (example: UV-A and UV-B), a selective exposure from different angles can hereby be effected. The advantages lie in the use of only one exposure mask or in the ability to maintain the register of the two images.

By register or registration, or register accuracy or registration accuracy, is meant a positional accuracy of two or more elements and/or layers relative to each other. The register accuracy is to range within a predetermined tolerance and be as low as possible. At the same time, the register accuracy of several elements and/or layers relative to each other is an important feature in order to increase the process stability. The positionally accurate positioning can be effected in particular by means of sensory, preferably optically detectable registration marks or register marks. These registration marks or register marks can either represent special separate elements or areas or layers or themselves be part of the elements or areas or layers to be positioned.

Black/white representations, grayscale images, color images, images with areas of different UV absorption ("color image" in the UV range), half-tone images, etc. can be provided as master images 14*lm*, 14*rm*.

Generation of three-dimensional images which give e.g. a depth effect to a represented object is also possible.

FIG. 7.3 shows an exposure device 17 which is formed like the exposure device described in FIG. 7.2, with the difference that the master image is formed as an electronically controllable display 17*d*, which can be controlled via a computer 17*c*. The display 17*d* can be formed, for example, like a display known from laser projectors. The display 17*d* makes the introduction of individualized items of information into the photoresist or into the image layer possible. Examples of individualized items of information are serial numbers, the date of birth of a document holder or the image of a person. The radiation source 17*l* can advantageously be formed as a laser, with the result that the laser beam can be deflected in a suitable manner and its intensity can be modulated, for example switched on and off, in a targeted manner.

A polarizer can additionally be located in the beam path, by means of which light polarized linearly or circularly can be produced.

The condenser lens 17*k* illuminates the master image 14*lm*, 14*rm* arranged in the holder 17*a* evenly. The master image 14*lm*, 14*rm* is arranged with respect to the projection objective lens 17*o* such that the master image 14*lm*, 14*rm* is projected onto the lens array in a limited angular range.

FIGS. 6.5 and 6.6 show a fifth method step which corresponds to the method step described further above in FIGS. 4.7 and 4.8. The image layer 14 which comprises the partial images 14*l* and 14*r* is represented in FIG. 6.6.

The use of a line exposure or a line array as exposure unit is also possible. By a line exposure is meant an exposure unit in which the exposure is effected via a very narrow exposure line. This can be effected by exposure by means of a slit. The slit is passed here above the surface to be exposed and/or the surface to be exposed is passed underneath the linear slit. A metallic diaphragm can e.g. be used as linear slit. An arrangement of UV diodes arranged next to each other, a so-called array, can also be used as line exposure unit. The line array, preferably with high resolution, can thus be moved over the surface to be exposed during the exposure. For example, the arrangement of the individual exposure elements in the line array can correspond to a resolution of from 600 dpi to 3600 dpi. Alternatively, the surface to be exposed moves underneath the line array. The latter is advantageous in particular in the case of roll-to-roll methods.

FIGS. 8.1 to 8.12 show a third embodiment example of the method according to the invention. FIGS. 8.1 to 8.12 are schematic sectional representations, wherein, for a better overview, layers are each represented as a rectangular area.

FIG. 8.1 shows a first method step in which the carrier film 13, on the upper side of which the lens layer 11*l* is formed, is provided. The structure of the lens layer 11*l* is described further above.

FIG. 8.2 shows a second method step in which a semi-transparent metal layer 18*ms* is applied, preferably by vapor deposition, to the underside of the carrier film 13.

FIG. 8.3 shows a third method step in which a photoresist 16 is applied to the semitransparent metal layer 18*ms*.

FIG. 8.4 shows a fourth method step in which a first master image 14*lm* is transferred by a parallel projection onto the lens layer 11*l* and is focused by the microlenses 12 of the lens layer 11*l* on a first photoresist 16. The projection beams strike the lens layer 11*l* at a first angle of incidence $\beta_l$, which is equal to a first observation angle. A first latent partial image is formed in the first photoresist 16 by the exposure.

FIGS. 8.5 and 8.6 show a fifth method step in which the exposed first photoresist 16 is developed to form a first image layer 14*l* formed as etching mask, as described further above. The first image layer 14*l*, which is formed from image sections 14*la*, is represented in FIG. 8.6.

FIG. 8.7 shows a sixth method step in which the semi-transparent metal layer 18*ms* is structured by means of etching, whereby the areas of the metal layer 18*ms* not covered by image elements of the first image layer 14*l* are removed. An aqueous lye can e.g. be used as etching medium.

FIG. 8.8 shows a seventh method step in which a second photoresist 16 is applied to the first image layer 14*l*.

FIG. 8.9 shows an eighth method step in which the lens layer 11*l* is covered by a compensation layer 11*k*. The compensation layer 11*k* has the same or approximately the same optical refractive index, in particular with a refractive index difference of at most 0.2, as the microlenses 12 of the lens layer 11, with the result that the optical effect of the microlenses 12 is compensated for. The compensation layer 11*k* can be, for example, a liquid.

FIG. 8.10 shows a ninth method step in which the first image layer 14*l* acts as an image mask. In the embodiment example represented in FIG. 8.10, parallel projection beams strike the first image layer 14*l* perpendicularly, expose the second photoresist 16 arranged underneath the first image layer 14*l* and generate a latent partial image. It is also possible to place a translucently dyed layer in the background, in particular followed by a metal layer, in order to create the effect of a colored reflective layer.

In a tenth method step, the compensation layer 11*k* is again removed from the lens layer 11*l*.

FIGS. 8.11 and 8.12 show an eleventh method step in which the latent image formed in the second photoresist 16 is developed to form a second image layer 14*r* formed from flat areas such as e.g. image strips 14*ra*. The image strips 14*ra* are (permanently) visible over a very large angular range.

FIGS. 10.1 to 10.8 show a fourth embodiment example of the method according to the invention.

The method steps represented in FIGS. 10.1 to 10.8 are formed like the method steps described in FIGS. 4.1 to 4.8, with the difference that the exposure of the photoresist 16 is effected by a micro-optical system formed as a diaphragm layer 11*b*. The diaphragm layer 11*b* can be constructed from alternating transparent and opaque or partially opaque areas. In the simplest case, it can comprise line grids, which are e.g. printed on. However, it can also comprise more complex arrangements of transparent and opaque areas. The grid width is chosen such that it lies below the resolution of the human eye, as described further above in FIG. 1 for microlenses.

FIGS. 18*a* to 18*c* show embodiment examples of diaphragm layers 11*b* with line grids, wherein the directional arrows shown in the figures indicate the tilting direction of the security element.

In FIG. 18*a*, the line grid is arranged perpendicular to the tilting direction, in FIG. 18*b* oblique to the tilting direction and in FIG. 18*c* parallel to the tilting direction.

Figure 19:
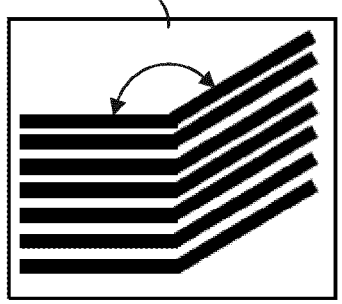
FIG. 19 a second embodiment example of a diaphragm layer.

FIG. 19 shows an embodiment example of the diaphragm layer 11*b* in which the line grid is formed from two sections which form an obtuse angle with each other, as drawn in FIG. 19.

Figure 20:
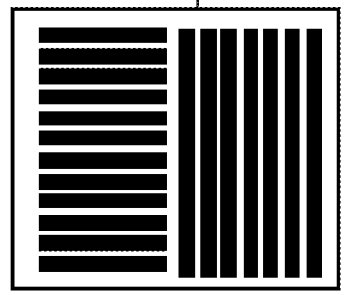
FIG. 20 a third embodiment example of a diaphragm layer.

FIG. 20 shows an embodiment example of the diaphragm layer 11*b* in which the line grid is formed from two sections which are arranged at a right angle to each other.

Figure 21:
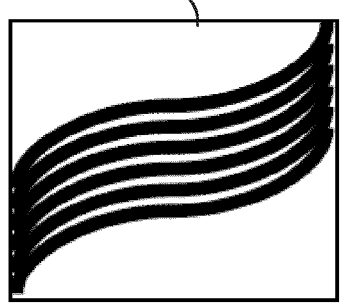
FIG. 21 a fourth embodiment example of a diaphragm layer.

FIG. 21 shows an embodiment example of the diaphragm layer 11*b* in which the line grid is formed S-shaped.

Figure 22:
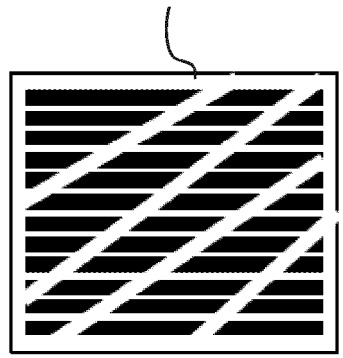
FIG. 22 a fifth embodiment example of a diaphragm layer.

FIG. 22 shows an embodiment example of the diaphragm layer 11*b* in which the line grid is interrupted by linear sections running obliquely.

Figure 23:
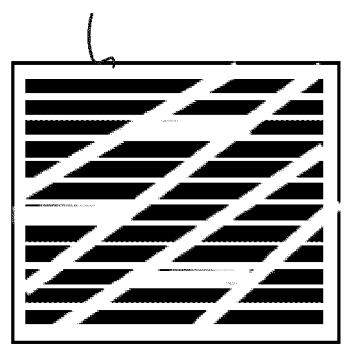
FIG. 23 a sixth embodiment example of a diaphragm layer.

FIG. 23 shows an embodiment example of the diaphragm layer 11*b* in which the line grid is interrupted by linear sections running obliquely and lines of the line grid are interrupted alternately.

Instead of the line grids specified in FIGS. 18*a* to 24, cylindrical lenses arranged analogously can also be used.

Figure 24:
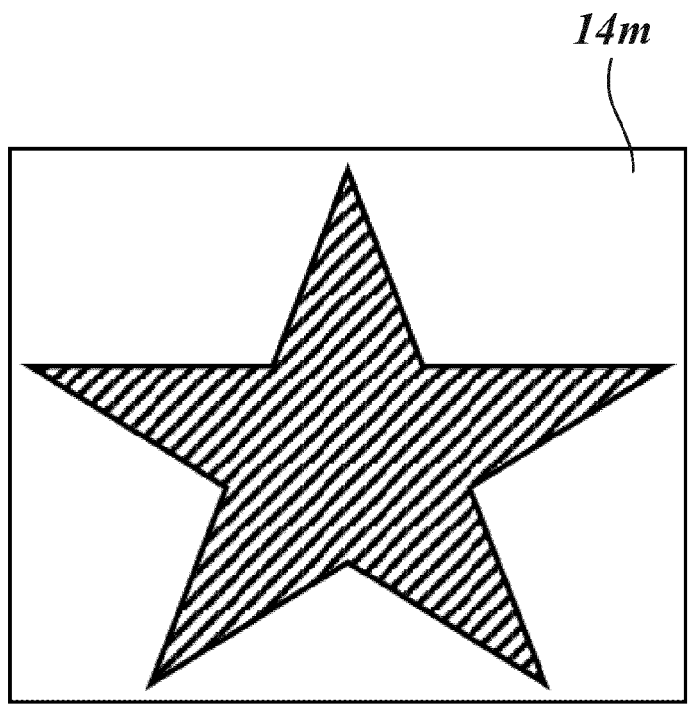
FIG. 24 a seventh embodiment example of a diaphragm layer.

FIG. 24 shows an embodiment example of the diaphragm layer 11*b* in which the line grid has a star-shaped boundary, which can be perceived by an observer as a star-shaped symbol.

FIGS. 11.1 to 11.7 show a fifth embodiment example of the method according to the invention.

FIG. 11.1 shows a first method step in which a carrier film 13, on the upper side of which a lens layer 11*l* is formed, is provided. The structure of the lens layer 11*l* is described further above.

FIG. 11.2 shows a second method step in which a photoresist 15 is applied to the underside of the carrier film 13, e.g. in the form of a field or a pattern in a defined area. The application can be effected e.g. by means of a printing process or also by transfer from a carrier by means of hot stamping or cold stamping.

The method steps of applying the photoresist 15 and applying or introducing the microlenses of the lens layer 11*l* can also be carried out in a modified sequence or also simultaneously. Positive photoresists and/or negative photoresists can be used.

Depending on the subsequent process, the photoresist 15 can be colorless or pigmented and/or dyed and/or can be printed multicolored. Dissolved dyes and/or pigments, also special pigments as are used in the security field, for example UV-fluorescent pigments, are used as colorings. Pigments with small grain sizes below the layer thickness of the photoresist 15 are preferred. So-called nanopigments, i.e. pigments with grain sizes below 1 µm, preferably below 0.5 µm, are further preferred. The pigments can be inorganic or organic in nature or can be mixtures of the two. In addition to pigments, soluble dyes can also be used.

The photoresist 15 can be transparent, semitransparent or opaque, optionally opaque only in particular wavelength ranges. Thus a colored photoresist 15 can be largely transparent, for example in the near-UV in which the photoresist 15 is sensitive, but can appear substantially black in the visible wavelength range.

Liquid-crystalline materials can also be used as photoresists 15, in which, optionally additionally, spatial orientations of the liquid-crystalline molecules take place during the exposure process or curing process. The orientation of the molecules can be formed e.g. on physical structures, such as e.g. microstructures, and/or also through exposure by means of polarized light.

The photoresists 15 can be applied colorless or single-colored or multicolored.

FIG. 11.3 shows a third method step in which the photoresist 15 is exposed through the lens layer 11*l* with parallel light beams at a first angle of incidence $\beta_l$, which is equal to a first observation angle. A first latent partial image is formed in the photoresist 15 by the exposure.

In principle, all suitable methods for producing parallel light or virtually parallel light can be used. These also include the use of lasers or laser diodes, optionally in combination with suitable optics.

FIG. 11.4 shows a fourth method step in which the exposed photoresist 15 is developed to form a first partial image 14*l* and optionally a fifth method step in which a further photoresist 15 is applied. The further photoresist 15 is applied to the underside of the carrier film 13, e.g. in the form of a further field or a pattern in a defined area. The further photoresist 15 can be applied next to the first partial image 14*l*, partially overlapping or congruent with it. In the embodiment example represented in FIG. 10.4, the further photoresist 15 is applied next to the first partial image 14*l*.

FIG. 11.5 shows a sixth method step in which the further photoresist 15 is exposed through the lens layer 11*l* with parallel light beams at a second angle of incidence $\beta_r$, which is equal to a second observation angle. A second latent partial image is formed in the further photoresist 15 by the exposure.

FIG. 11.6 shows a seventh method step in which the exposed further photoresist is developed to form a second partial image 14*r*.

The sixth and the seventh method steps can be repeated several times.

FIG. 11.7 shows a variant in which the second partial image 14*r* partially covers the first partial image 14*l*.

FIGS. 9.1 to 9.15 show further embodiment examples of security elements 1, which can be produced with the above-described methods and/or by variation of the above-described methods. FIGS. 9.1 to 9.15 are schematic sectional representations, wherein, for a better overview, layers are each represented as a rectangular area.

The security elements 1 can optionally be formed with a single- or multi-ply adhesive layer, not represented in FIGS. 9.1 to 9.15, on their underside. Optionally, the underside of the security element 1 represented in FIGS. 9.1 to 9.13 can also have one or more additional layers, such as e.g. a single- or multilayered bonding layer and/or primer layer. However, it can also be provided to transfer the security elements 1 onto a substrate which is coated with an adhesive layer at least in areas. Optionally, the security element can have an additional single- or multilayered protective layer, for example in the form of a PET film, on the underside. This can be glued or laminated on. The protective layer can have an additional single- or multilayered adhesive layer on the outside. The structure makes it possible to embed the security element in a substrate, for example in the form of a security thread in a document or a banknote.

FIG. 9.1 shows a security element 1 in which the image layer 14 is covered by a color layer 18*f*. The color layer 18*f* can be printed on, for example. The color contrast is increased by the color layer 18*f*. The color layer 18*f* can be formed, for example, translucent or opaque and/or multicolored and/or UV-active. Opaque layers or also opaque and scattering layers are in particular preferred. The color layer 18*f* is visible at a plurality of observation angles when observed through the lens layer.

FIG. 9.2 shows a security element 1 in which the image layer 14 is covered by a reflective layer 18*r*. A metal layer and/or an HRI layer can be provided as reflective layer 18*r*. Optionally, after applying the reflective layer 18*r* a structuring of the reflective layer 18*r* can be provided registered relative to the image layer 14, whereby the color effect is enhanced. The structuring can be effected by known methods.

FIG. 9.3 shows a security element 1 in which a multilayer structure is applied to the image layer 14. In the embodiment example represented in FIG. 9.3, the multilayer structure comprises a semitransparent metal layer 18*mt* as absorber layer, a spacer layer 18*a* and a reflective layer 18*r*. The semitransparent metal layer 18*mt* is arranged on the underside of the image layer 14. In the case of the thus-formed security element 1 a color change effect is visible as background. A structure in which the reflective layer 18*r* is located on the underside of the image layer 14 ("reverse structure"), followed by a spacer layer and a semitransparent layer is also possible. In the case of the last-named structure a color change effect is visible from the side facing away from the lens layer 11. Embodiments in which the color change is visible from both sides of the security element 1 are also possible.

FIG. 9.4 shows a security element 1 which is produced according to the first method described further above (FIGS. 4.1 to 4.8 and FIGS. 6.1 to 6.6), with the difference that instead of the image layer 14 firstly a first image layer 14*l* is formed, and then a further photoresist 16 is deposited and a second image layer 14*r* is formed after exposure and development. The two image layers 14*l* and 14*r* can advantageously have different colors. It is also possible to apply the two photoresists in a strip grid, to expose and to develop them together.

FIG. 9.5 shows a security element 1 which is formed like the security element represented in FIG. 9.4, with the difference that the two photoresists 16 are formed with different sensitivity. For example, the first photoresist 16 can be formed with a higher sensitivity than the second photoresist 16.

By using differently colored photoresists it is possible to form mixed colors, for example the mixed color magenta from the colors red and blue.

It can further be provided to arrange the security element on a substrate or product, e.g. a security document, with an arrangement of cylindrical lenses running obliquely to the horizontal or vertical tilt axis of the security element. This arrangement results in an image flip in the case of tilting both via the horizontal and vertical tilt axis.

FIG. 9.6 shows a security element 1 in which a microstructure 13*s* is molded into the underside of the carrier film 13. The microstructure 13*s* can also be introduced into a further layer applied to the carrier film 13. The microstructure 13*s* can form different optical effects, for example a KINEGRAM® or 2D/3D or 3D structure-based effects. The image layer 14 is coated with a reflective layer 18r. The coating can optionally be provided.

A combination of a microstructure with a structure analogous to FIG. 8.7 is also possible.

FIG. 9.7 shows a security element 1 in which a semi-transparent metal layer 18ms is arranged on the underside of the carrier film 13, wherein the metal layer 18ms was partially demetallized after the formation of the image layer 14 formed as etching mask. The security element 1 thus has an image layer 14 metallically coated from the observation side. Optionally, an additional color layer can be applied to the rear side of the image layer in order to increase the contrast and/or in order to produce colored areas. It is also possible to place a second metal layer, e.g. dyed a different color with a translucent color varnish layer, in the background, analogously to the embodiment described in FIG. 8.7.

FIG. 9.8 shows a security element 1 in which the rear side of the security element 1 is formed by a structured metal layer 18m. The structured metal layer 18m has areas removed in the lift-off method which are congruent with the structured image layer 14. For this, the image layer 14 was vapor-deposited with the metal layer 18m and the image layer 14 was then removed in the exposed areas in the lift-off method, wherein a positive photoresist was used in this embodiment example. Optionally, the structured metal layer 18m can have a color layer placed behind it. It is also possible to place a translucently dyed layer in the background, in particular followed by a metal layer, in order to create the effect of a colored reflective layer.

FIG. 9.9 shows a security element 1 in which a transfer ply 18u of a transfer film is arranged on the image layer 14. The image layer 14 is formed as a thermal adhesive which, after heating, is brought into contact with the transfer ply 18u formed on the transfer film, and, after cooling, the transfer ply adheres to the image layer by means of the thermal adhesive. Then the security element 1 is detached from the transfer film, wherein the areas of the transfer ply 18u glued to the image layer 14 are detached. In this embodiment of the security element 1 a wide variety of designs are possible. Thus, for example, a continuous color gradient or a true color image can be formed or optical structures can be transferred onto the image layer 14.

FIG. 9.10 shows a security element 1 in which a volume hologram 18v is arranged on the image layer 14.

FIG. 9.11 shows a security element 1 in which a partially metallized layer 18mp is arranged between the underside of the carrier film 13 and the dyed image layer 14. The security element 1 forms a color-metal flip. The effect can occur by tilting the security element 1 or by rotation through 180°. A continuous metal/color transition can be formed in one exposure. Optionally, a metal/color flip can be formed by two exposures and structuring.

Continuous transition: an exposure and utilization of the colored photoresist as coloring in one area and for the further structuring of the metal layer partially produced beforehand in the other area.

Metal/color image flip: first structuring of a metal layer by means of a first exposure, then structuring of a separately applied colored photoresist by means of a second exposure.

FIG. 9.12 shows a further security element 1 which was produced according to the method described further above in FIGS. 8.1 to 8.12.

FIG. 9.13 shows a security element 1 in which a functional layer 18v is arranged underneath the carrier film 13, on the side of which facing away from the carrier film 13 there is arranged a multilayered image layer comprising a first image layer 14, a reflective layer 18r and a second image layer 14'.

FIG. 9.14 shows a security element 1 which is formed like the security element described in FIG. 1, with the difference that the security element 1 has a first area which is formed as described in FIG. 1, and that the security element 1 has a second area which is formed as a mirror image of the first area. In the second area, the lens layer 11l is arranged on the underside of the security element 1. The image layer 14 is arranged on the upper side of the security element 1. The security element 1 can be arranged, for example, in a window of a security document, wherein different optical effects can be formed when the front side and the rear side of the security element 1 are observed. It can also be provided to form the window in the security document 1 such that it only enables the second area to be viewed. The first and/or the second area can have partial areas not connected to each other. For example, the partial areas can be formed as elements of a grid.

FIG. 9.15 shows a security element 1 which was produced by combining two security elements corresponding to FIG. 4.8 and FIG. 9.1.

The production can be effected, for example, by laminating the two security elements by means of an adhesive 19.

Figure 25:
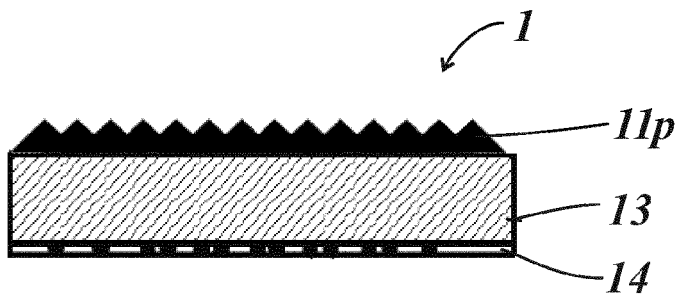
FIG. 25 a sixteenth embodiment example of a security element.
Figure 26:
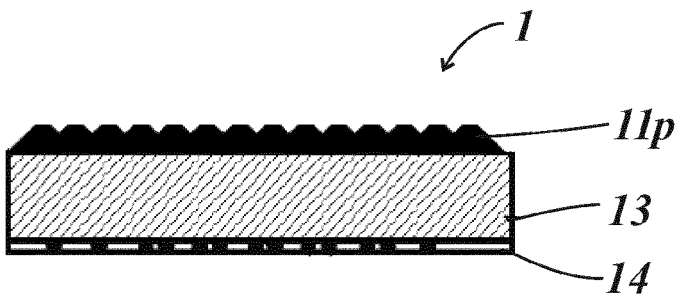
FIG. 26 a seventeenth embodiment example of a security element.

FIGS. 25 and 26 show security elements 1 in which the micro-optical layer is formed as a prism layer 11p, wherein the prism layer is formed trapezoidal in cross section in FIG. 26.

The security elements described in FIGS. 9.1 to 9.15, 25 and 26 can form many and varied optical effects, wherein it is also possible to form combinations of the security elements represented in FIGS. 9.1 to 9.15 as well as 25 and 26.

It is possible to form stereoscopic effects when the two partial images 14l and 14r form a stereoscopic pair of images.

It is further possible to generate quasi-continuous movements of the images, wherein the movement, i.e. the positional change of the images, can occur when the observation position is continuously changed.

A morphing effect can be achieved in a similar way, wherein a first image is transformed via various stages into a second image.

The security elements 1 can be observed in reflection and/or in transmission.

The image layer or image layers can represent a static image on the side facing away from the micro-optical elements.

Following the production of the image layer 14 further layers can be applied over the whole surface or partially, e.g. by printing or by transfer of a transfer ply from a carrier, in particular by hot stamping and/or cold stamping. A partial removal after the application, e.g. a so-called demetallization, is also possible. The layers can be metals, for example aluminum, HRI layers, colorless or dyed (e.g. dyed to complement the color of the image layer 14) single- or multi-ply plastic layers, primer layers of inorganic or organic nature, adhesive layers, etc.

The sequence is as far as possible as desired. Layers can also appear several times. The application of further layers to the rear side of the image layer 14 is of interest because different effects from the front and rear side can thus be realized.

By using several differently dyed photoresists, e.g. color images, in particular true color images, can be generated.

It is also possible to introduce optical structures into the image layer or into additional layers, e.g. by replication (thermal replication or UV replication). Optical structures can, however, also be introduced into a spacer layer before the image layer is applied.

The spacer layer can be a volume hologram layer.

Between the lens layer 11 and the image layer 14, a plurality of additional materials can be present, for example
- dyed layers (over the whole surface or in areas);
- pigmented layers (security pigments, for example UV-fluorescent pigments);
- printed layers (over the whole surface or in areas);
- layers which can be inscribed by means of a laser;
- layers with polarizing properties;
- HRI layers, for example made of ZnS.

The security elements can be formed with further elements which can serve, for example, as in particular static optical reference points, lines, etc. for the movement. Further elements could be additional Moiré elements, further printed or optically variable or metallic representations, which supplement or complement the image flip. The image flip represented can also be represented by one or more further technologies, for example by an optically variable element. Here, the image flip can be effected synchronously, asynchronously or inversely.

Elements of the image layer can also be used as markings, in particular as register marks and/or control marks for controlling further process steps, in particular for applying further layers and/or elements.

Combinations with further security elements or decorative elements can further be provided, which can be formed, for example, as a hologram, a Kinegram®, a lens effect, a volume hologram, security print, a decorative print, a UV-fluorescent print, a print of upconverters (IR upconverters), an OVI (Optically Variable Ink) print and as machine-detectable pigments (3rd line features). The combinations can be arranged next to each other. They can also be arranged interlaced in each other or overlapping. Image elements as well as data etc. contained therein can be complementary to each other, can supplement each other or can be repeated in various technologies.

The partial images contained in the image layer can be supplemented with further images or items of information of the security element 1. Thus the partial images of the image layer can present, with printed items of information outside the security element 1, an overall image or overall images. Here, a part of the overall image would be variable in particular through the lenticular flip.

Through a combination with an optically variable element, different overall partial images could be generated by partial items of information from lenticular flip and optically variable elements, which would be visible at different observation angles.

A further example would be the combination with an optically variable printing ink. Thus the colors of the optically variable ink, occurring at different observation angles, could be visible synchronously with the colors of the lenticular flip.

The security elements can provide additional functions such as machine-readability in addition to the optical effects. A lenticular flip or a Moiré magnifier can be machine-readable, wherein different barcodes or positive/negative barcodes can be displayed. These codes can be used for authentication/verification.

The image layer 14 can contain a Moiré encoding, i.e. one or more images of the image flip can additionally be analyzed using a Moiré analyzer or via an image capture and processing. The capture of a Moiré effect can also be effected from the side facing away from the lenses.

A lenticular flip can contain Moiré magnifier information which is analyzed by a second analyzer, wherein the Moiré analyzer is positioned above the lens layer.

The above-described security elements can be used, for example, in the following security documents:
- state or non-state personal documents (passport, identity card, visa, driver's license, birth certificate, motor vehicle license plate, gun licenses, etc.
- banknotes, checks, certificates
- credit cards; articles of value; tickets; access identity cards The security elements are in particular suitable in so-called documents with window technology with transparent areas for observation in transmitted light and/or observation from the front and rear side. So-called window banknotes can be banknotes with physical openings in the substrate or, for example, polymer banknotes with transparent polymer areas. The security elements 1 can partially or completely cover the window area, wherein an observation in the window area both from the front and the rear side of the banknote is possible in reflection and/or in transmission. In the case of polymer banknotes, the security element can also be constructed directly on the substrate, i.e. the polymer substrate would represent the carrier substrate.

The security element can likewise be part of a plastic card, wherein the security element 1 is applied to a plastic card or is produced as an embedded and/or integral part of the plastic card.

The above-described elements can, however, also be used outside the field of security documents or outside the security field for decorative articles and advertising materials or as functional elements, for example as components of displays and spectacles.

The security elements are particularly suitable for products with so-called see-through elements, such as e.g. window banknotes, security thread applications for banknotes and/or documents with transparent areas, etc.

The security elements can be applied to objects or introduced (embedded) into objects.

FIGS. 27 to 36 show embodiment examples of security documents which are formed with one or more of the above-described security elements.

Figure 27:
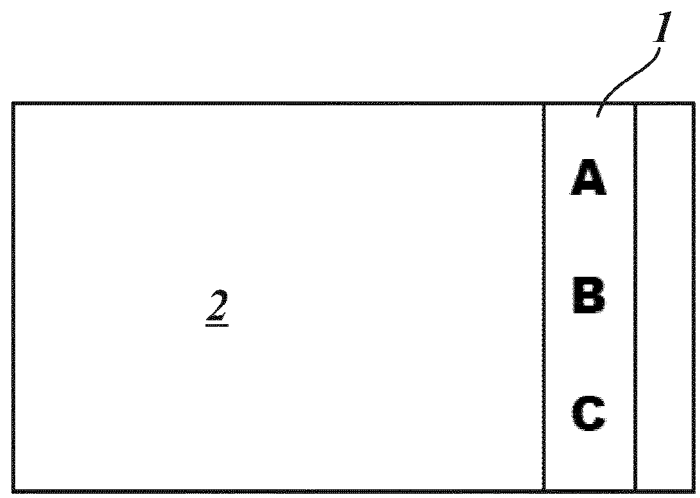
FIG. 27 a first embodiment example of a security document.

FIG. 27 shows a security document 2 formed as a banknote, which has a strip-shaped security element 1.

Figure 28A:
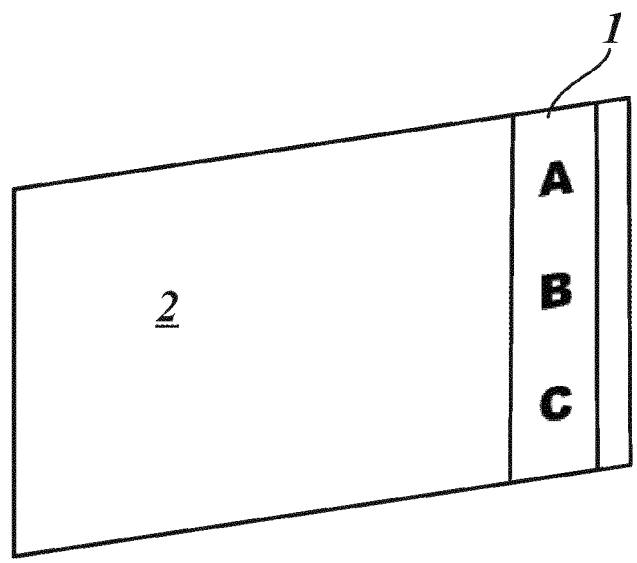
FIGS. 28a and 28b a second embodiment example of a security document.
Figure 28B:
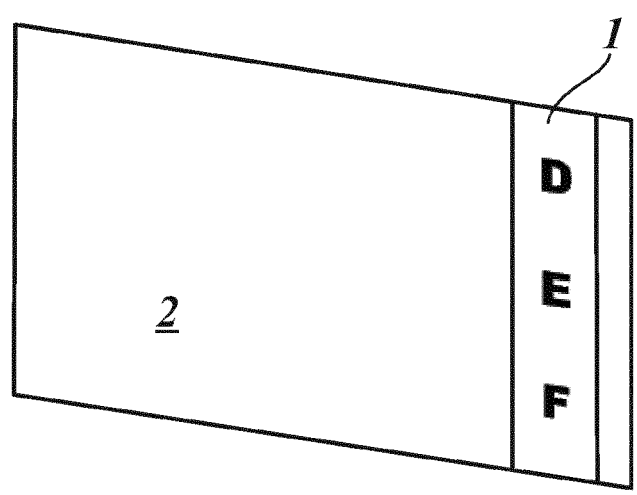

FIGS. 28a and 28b show a security document 2 formed as a banknote, which has a strip-shaped security element 1, at different tilt angles. The image motifs of the security element 1, symbolized by letters, change from A, B, C to D, E, F.

Figure 29:
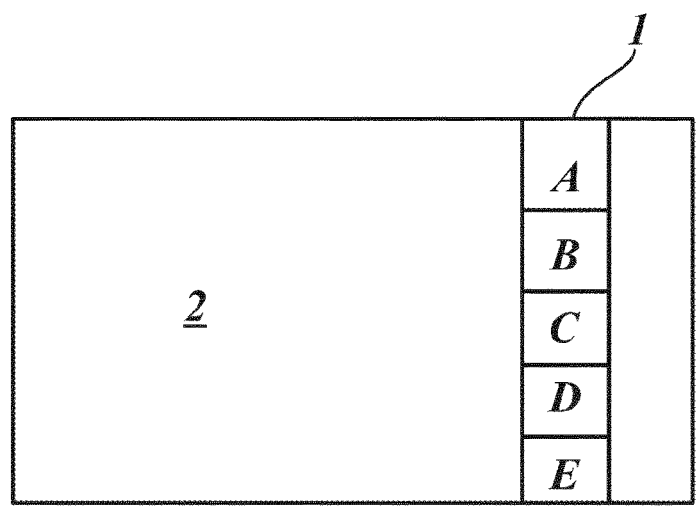
FIG. 29 a third embodiment example of a security document.

FIG. 29 shows a security document 2 formed as a banknote, which has a strip-shaped security element 1, which is formed in sections with different image effects:
A: lenticular flip element based on microlenses
B: 2D/3D hologram
C: Kinegram®
D: lenticular flip element based on opaque strips
E: optically variable ink print The areas A to E can be arranged adjacent to each other and/or overlapping each other.

Figure 30A:
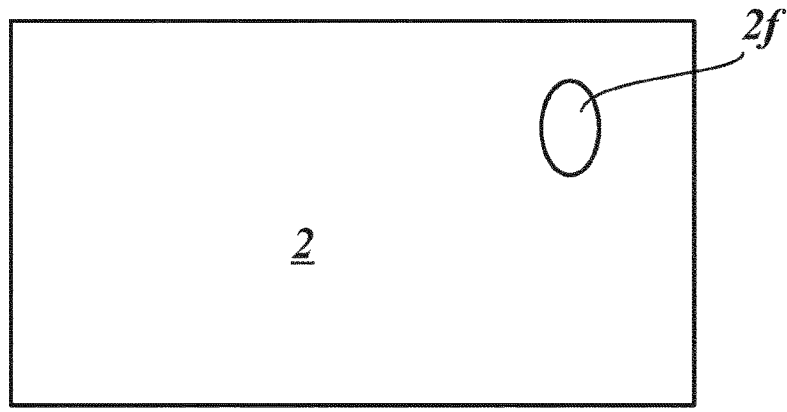
FIGS. 30a and 30b a fourth embodiment example of a security document.

FIG. 30a shows a security document 2 formed as a banknote, which has a window 2f1.

Figure 30B:
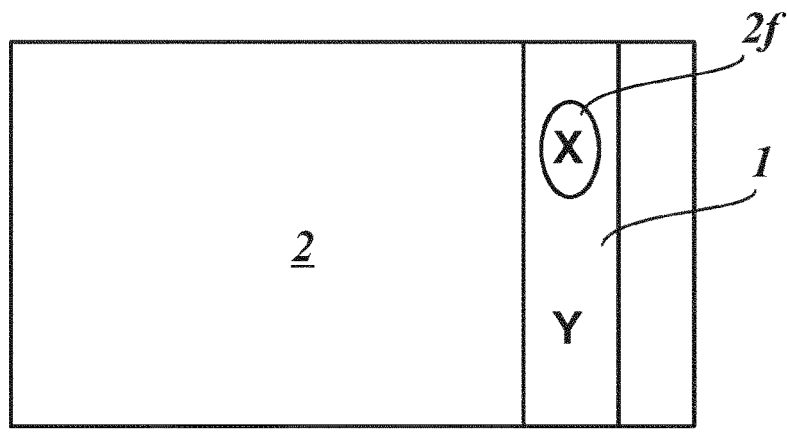

FIG. 30b shows the security document represented in FIG. 30a, which is formed with a strip-shaped security element 1 laminated onto its front side which covers the window 2f. The security element 1 has a first motif symbolized by the letter X which is arranged above the window 2f, and a second motif symbolized by the letter Y which is arranged underneath the first motif outside the window 2f.

FIGS. 31a and 31b show a security document 2 which is formed like the security document described in FIG. 30b, with the difference that a first motif symbolized by the letter A which is arranged above the window 2f is visible when the security document 2 is tilted about a perpendicular axis in a first tilting position and is invisible in a second tilting position, and that a second motif symbolized by the letter B which is arranged underneath the first motif outside the window 2f is invisible in the first tilting position and is visible in the second tilting position.

FIGS. 32a and 32b show a security document 2 which is formed like the security document described in FIGS. 31a and 31b, with the difference that the motif arranged above the window 2f and symbolized by the letter A is visible in both tilting positions when observed from the rear side.

Figure 33:
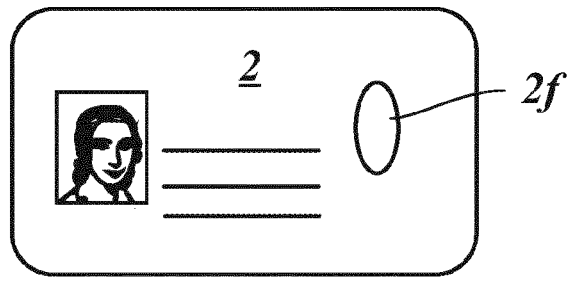
FIG. 33 a seventh embodiment example of a security document.
Figure 34:
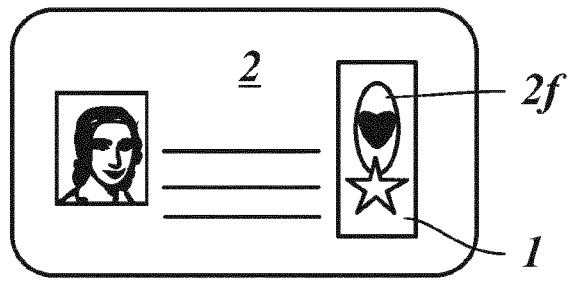
FIG. 34 an eighth embodiment example of a security document.

FIGS. 33 and 34 show a security document 2 with a window 2f formed in the card format ID1.

FIG. 34 shows a security document 2 which is formed like the security document described in FIG. 33, with the difference that a strip-shaped security element 1 which covers the window 2f is laminated onto the front side of the security document 2. The security element 1 has a heart-shaped lenticular flip element which is arranged above the window 2f, as well as a star-shaped hologram which is arranged underneath the window 2f.

Figure 35:
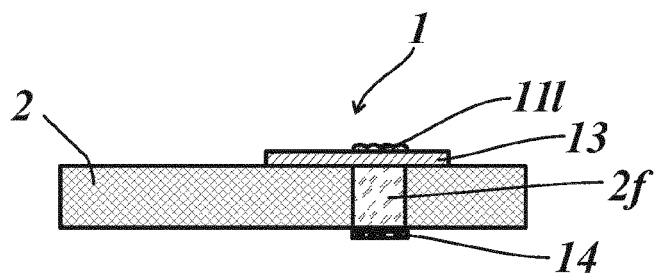
FIG. 35 a ninth embodiment example of a security document in a schematic sectional representation.

FIG. 35 shows a security document 2 with a window 21 in a schematic cross section, in which a lens layer 11l and a carrier substrate 13 of a security element 1 are arranged on the front side of the security document 2 above the window 21, wherein an image layer 14 corresponding to the lens layer 11l is arranged on the rear side of the security document 2.

Figure 36:
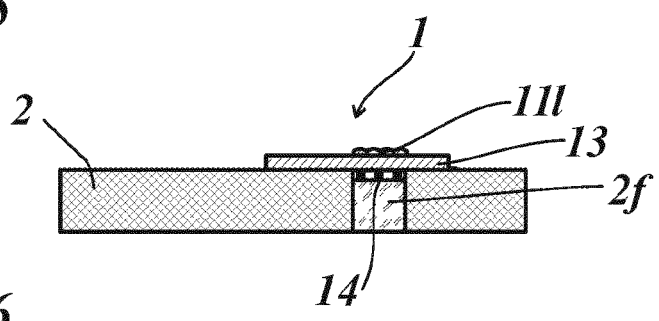
FIG. 36 a tenth embodiment example of a security document.

FIG. 36 shows a security document 2 which is formed like the security document described in FIG. 35, with the difference that the image layer 14 is arranged on the rear side of the carrier substrate 13.

LIST OF REFERENCE NUMBERS 1 security element
1a tilt axis
2 security document
2f window
11 micro-optical layer
11b diaphragm layer
11k compensation layer
11l lens layer
11p prism layer
12 microlens
12l longitudinal row
12k ball lens
12r transverse row
12z cylindrical lens
13 carrier substrate; carrier film
13s microstructure
14, 14' image layer
14l first partial image
14la image section of the first partial image
14lm first master image
14m master image
14mm third master image
14r second partial image
14ra image section of the second partial image
14rm second master image
15 replication layer
15s stamping die
16 photoresist
17 exposure device
17c computer
17d display
17l radiation source
17k condenser lens
17o projection objective lens
18a spacer layer
18f, 18fl, 18fr color layer
18r reflective layer
18m metal layer
18mp partially metallized layer
18ms semitransparent metal layer
18mt transparent metal layer
18u transfer ply
18v functional layer
19 adhesive layer
$\alpha_e$ incident azimuth
$\alpha_l$ x-azimuth
$\alpha_q$ y-azimuth
$\beta_e$ angle of incidence
$\beta_{el}$ first angle of incidence
$\beta_{er}$ second angle of incidence

The invention claimed is:

1. A method for producing a security element comprising a micro-optical layer, wherein the micro-optical layer comprises an array formed from micro-optical systems, a carrier substrate and one image layer or several image layers, wherein the one image layer or several image layers comprises or comprise n partial images for n=1 to i which are visible from an n-th observation angle allocated to the n-th partial image, and wherein n is at least 1, and wherein the following method steps are provided:
    a) providing the carrier substrate, on the upper side of which the micro-optical layer is formed;
    b) applying a photoresist to the underside of the carrier substrate;
    c) forming a latent n-th partial image in the photoresist, wherein an n-th master image is projected onto the micro-optical layer with parallel light beams incident at an n-th angle of incidence and an n-th incident azimuth, or
    wherein the photoresist in step b) is applied in the form of an n-th master image to the underside of the carrier substrate and wherein the photoresist is exposed through the micro-optical layer with parallel light beams incident at an n-th angle of incidence and an n-th incident azimuth;
    d) repeating method step c) i−1 times until the i-th latent partial image is formed;
    e) developing the photoresist to form the image layer, wherein method steps b), c) and e) are performed with an n-th photoresist formed with an n-th color and/or an n-th sensitivity, and wherein method steps b), c) and e) are repeated (i−1) times, wherein i is at least 2.

2. The method according to claim 1, wherein, after the second variant of method step c) in which the photoresist in step b) is applied in the form of an n-th master image to the underside of the carrier substrate and the photoresist is exposed through the micro-optical layer with parallel light beams incident at an n-th angle of incidence and an n-th incident azimuth, method step e) is carried out before method step d).

3. The method according to claim 1, wherein the micro-optical systems in the array form a pattern formed as a security feature and/or as a decorative feature of the security element.

4. The method according to claim 1, wherein the micro-optical layer comprises differently formed arrays of micro-optical systems.

5. The method according to claim 1, wherein the micro-optical layer comprises a diaphragm layer which has transparent and opaque areas.

6. The method according to claim 1, wherein the micro-optical layer comprises an array formed from micromirrors.

7. The method according to claim 1, wherein the micro-optical layer comprises an array formed from microlenses.

8. The method according to claim 7, wherein the microlenses are formed with at least two different focal lengths.

9. A method for producing a security element comprising a micro-optical layer, wherein the micro-optical layer comprises an array formed from micro-optical systems, a carrier substrate and one image layer or several image layers, wherein the one image layer or several image layers comprises or comprise n partial images for n=1 to i which are visible from an n-th observation angle allocated to the n-th partial image, and wherein n is at least 1, and wherein the following method steps are provided:
   a) providing the carrier substrate, on the upper side of which the micro-optical layer is formed;
   b) applying a photoresist to the underside of the carrier substrate;
   c) forming a latent n-th partial image in the photoresist, wherein an n-th master image is placed on the micro-optical layer and is exposed with parallel light beams incident at an n-th angle of incidence and an n-th incident azimuth, or
   wherein an n-th master image is projected onto the micro-optical layer with parallel light beams incident at an n-th angle of incidence and an n-th incident azimuth, or
   wherein the photoresist in step b) is applied in the form of an n-th master image to the underside of the carrier substrate and wherein the photoresist is exposed through the micro-optical layer with parallel light beams incident at an n-th angle of incidence and an n-th incident azimuth;
   d) repeating method step c) i−1 times until the i-th latent partial image is formed; and
   e) developing the photoresist to form the image layer,
   wherein the micro-optical layer has two or more micro-optical systems with a longitudinal axis and a transverse axis arranged next to each other, wherein the longitudinal axes of the micro-optical systems are arranged at an x-azimuth to the long side of the carrier substrate.

10. The method according to claim 9, wherein the longitudinal axes of the micro-optical systems are formed as a curve.

11. The method according to claim 9, wherein the micro-optical systems are formed as cylindrical lenses.

12. The method according to claim 9, wherein the x-azimuth is equal to 90°.

13. The method according to claim 9, wherein, in method step b), a negative photoresist is applied.

14. The method according to claim 9, wherein, in method step b), a positive photoresist is applied.

15. The method according to claim 9, wherein, in method step b), a microstructure is formed in the underside of the photoresist facing away from the carrier substrate or in the underside of the image layer facing away from the carrier substrate.

16. The method according to claim 9, wherein, after method step e), a decorative layer is applied to the image layer.

17. The method according to claim 9, wherein, after method step e), one color layer or several color layers is or are applied to the image layer.

18. The method according to claim 9, wherein, after method step e), a metal layer and/or an HRI layer is applied to the photoresist or to the image layer.

19. The method according to claim 18, wherein the image layer is formed as an etching mask and areas of the metal layer or of the HRI layer not covered by image areas of the image layer are removed by etching.

20. The method according to claim 18, wherein the image layer is used as lift-off layer.

21. The method according to claim 9, wherein, after method step e), a multilayer structure comprising a semi-transparent metal layer, a spacer layer and a reflective metal layer is applied to the image layer.

22. The method according to claim 9, wherein, after method step e), the image layer is brought into contact with a transfer ply of a transfer film and the transfer ply is transferred from the transfer film to the image layer only at the points where the image layer is located.

23. The method according to claim 9, wherein, after method step e), a volume hologram layer is applied to the image layer.

24. The method according to claim 9, wherein method steps b), c) and e) are performed with an n-th photoresist formed with an n-th color, and wherein method steps b), c) and e) are repeated (i−1) times, wherein i is at least 2.

25. The method according to claim 9, wherein method step b), c) and e) are performed with an n-th photoresist formed with an n-th color and/or an n-th sensitivity, and wherein method steps b), c) and e) are repeated (i−1) times, wherein i is at least 2.

26. The method according to claim 25, wherein, in method step c), the exposure is carried out with an n-th exposure level.

27. The method according to claim 23, wherein the n photoresists are applied to the underside of the carrier substrate as n layers arranged at least partially one above the other.

28. The method according to claim 27, wherein the n photoresists are applied to the underside of the carrier substrate as a striped pattern.

29. The method according to claim 9, wherein the image layer is formed from two partial images wherein, in method step c), the exposure is effected with a first incident azimuth, and wherein, in method step d), the exposure is effected with a second incident azimuth, which differs by 90° from the first incident azimuth.

30. The method according to claim 9, wherein, before method step b), a semitransparent metal layer is applied to the underside of the carrier substrate wherein the photoresist is formed as an etch resist, and wherein, after method step e) is performed, the metal layer is removed by etching in the areas not covered by the image layer.

31. The method according to claim 30, wherein the semitransparent metal layer is formed with a transmittance in the range of from 5 to 70%.

32. The method according to claim 30, wherein the semitransparent metal layer is formed with a transmittance in the range of from 1% to 95%.

33. The method according to claim 9, wherein, before method step b), a layer formed with a microstructure is applied to the underside of the carrier substrate or the underside of the carrier substrate is formed with a microstructure.

34. The method according to claim 9, wherein, in method step c), the master image is formed as an electronically controllable display.

35. The method according to claim 9, wherein, in method step c) the parallel light beams projected onto the micro-optical layer are guided through filters and/or diaphragms before striking the micro-optical layer.

36. The method according to claim 9, wherein, in method step a), a carrier substrate is provided, in which in a first area the micro-optical layer is formed on the upper side of the carrier substrate, and in which, in a second area the micro-optical layer, is formed on the underside of the carrier substrate, and wherein method steps b) to e) are carried out in the second area as in the first area, with the difference that in the second area the upper side of the carrier substrate forms the underside of the carrier substrate and vice versa.

37. The method according to claim 36, wherein the first area and the second area of the carrier substrate overlap each other in an overlap area.

38. The method according to claim 9, wherein, in a final method step, an adhesive layer is applied to the underside and/or upper side of the security element.

39. The method according to claim 9, wherein the exposure or the projection is carried out in such a way that when the security element is observed from different observation directions, by tilting and/or rotating, a continuous or quasi-continuous image sequence of the n-th partial images becomes visible.

40. The method according to claim 9, wherein the micro-optical layer comprises an array formed from microlenses or an array formed from microlens grids and the exposure or the projection is carried out in such a way that the n-th partial images are generated as microimages, as microimages distorted in 1 or 2 dimensions or as parts of microimages, whereby, when the security element is observed from different observation directions, by tilting and/or rotating, a continuous or quasi-continuous image sequence of the n-th partial images becomes visible.

41. A method for producing a security element comprising a micro-optical layer, wherein the micro-optical layer comprises an array formed from micro-optical systems, a carrier substrate and one image layer or several image layers, wherein the one image layer or several image layers comprises or comprise n partial images for n=1 to i which are visible from an n-th observation angle allocated to the n-th partial image, and wherein n is at least 1, and wherein the following method steps are provided:
a) providing the carrier substrate, on the upper side of which the micro-optical layer is formed;
b) applying a photoresist to the underside of the carrier substrate;
c) forming a latent n-th partial image in the photoresist, wherein an n-th master image is placed on the micro-optical layer and is exposed with parallel light beams incident at an n-th angle of incidence and an n-th incident azimuth, or
wherein an n-th master image is projected onto the micro-optical layer with parallel light beams incident at an n-th angle of incidence and an n-th incident azimuth, or
wherein the photoresist in step b) is applied in the form of an n-th master image to the underside of the carrier substrate and wherein the photoresist is exposed through the micro-optical layer with parallel light beams incident at an n-th angle of incidence and an n-th incident azimuth;
d) repeating method step c) i−1 times until the i-th latent partial image is formed; and
e) developing the photoresist to form the image layer, wherein the micro-optical layer has two or more micro-optical systems arranged in an x-y grid, wherein the x-axis of the x-y grid is arranged at an x-azimuth to the long side of the carrier substrate and the y-axis is arranged at a y-azimuth to the short side of the carrier substrate.

42. The method according to claim 41, wherein the micro-optical systems are arranged in a distorted grid.

43. The method according to claim 41, wherein the micro-optical systems are formed as ball lenses.

44. A method for producing a security element comprising a micro-optical layer, wherein the micro-optical layer comprises an array formed from micro-optical systems, a carrier substrate and one image layer or several image layers, wherein the one image layer or several image layers comprises or comprise n partial images for n=1 to i which are visible from an n-th observation angle allocated to the n-th partial image, and wherein n is at least 1, and wherein the following method steps are provided:
a) providing the carrier substrate, on the upper side of which the micro-optical layer is formed;
b) applying a photoresist to the underside of the carrier substrate;
c) forming a latent n-th partial image in the photoresist, wherein an n-th master image is placed on the micro-optical layer and is exposed with parallel light beams incident at an n-th angle of incidence and an n-th incident azimuth, or
wherein an n-th master image is projected onto the micro-optical layer with parallel light beams incident at an n-th angle of incidence and an n-th incident azimuth, or
wherein the photoresist in step b) is applied in the form of an n-th master image to the underside of the carrier substrate and wherein the photoresist is exposed through the micro-optical layer with parallel light beams incident at an n-th angle of incidence and an n-th incident azimuth;
d) repeating method step c) i−1 times until the i-th latent partial image is formed; and
e) developing the photoresist to form the image layer, wherein the micro-optical layer comprises an array formed from microlenses, and
wherein the microlenses are formed with at least two different focal lengths, and
wherein the image layer is formed from a first and a second image layer, wherein the first image layer has a first partial image and the second image layer has a second partial image wherein method step b) is performed with a first photoresist wherein, after method step c), method step e) is performed to form the first image layer, and wherein the following further method steps are performed:
f) applying a semitransparent reflective layer to the first image layer;
g) applying a second photoresist to the semitransparent reflective layer;
h) temporarily embedding the micro-optical layer in a compensation medium formed with the optical refractive index of the micro-optical systems;

i) exposing the second photoresist, wherein the first image layer forms an exposure mask;
k) developing the second photoresist to form a second image layer, which is formed as an etching mask;
l) etching the semitransparent reflective layer;
m) removing the compensation medium.

* * * * *